United States Patent
Hayase et al.

(12) 
(10) Patent No.: US 6,740,596 B2
(45) Date of Patent: May 25, 2004

(54) MANUFACTURING METHOD OF ACTIVE MATRIX SUBSTRATE

(75) Inventors: Takasuke Hayase, Tokyo (JP); Hiroaki Tanaka, Tokyo (JP); Shusaku Kido, Kagoshima (JP); Toshihiko Harano, Kagoshima (JP)

(73) Assignee: NEC LCD Technologies, Ltd., Kanagawa (JP)

( * ) Notice: Subject to any disclaimer, the term of this patent is extended or adjusted under 35 U.S.C. 154(b) by 229 days.

(21) Appl. No.: 09/903,244

(22) Filed: Jul. 11, 2001

(65) Prior Publication Data
US 2002/0009890 A1 Jan. 24, 2002

(30) Foreign Application Priority Data
Jul. 11, 2000 (JP) ......................................... 2000/209994

(51) Int. Cl.[7] ...................... H01L 21/302; H01L 21/461
(52) U.S. Cl. ................... 438/706; 438/707; 438/708; 438/717; 438/725; 257/57; 257/79
(58) Field of Search ................. 438/706–710, 438/717, 725; 257/57, 59

(56) References Cited

U.S. PATENT DOCUMENTS

| | | | | |
|---|---|---|---|---|
| 4,231,811 A | * | 11/1980 | Somekh et al. | 148/1.5 |
| 5,635,337 A | * | 6/1997 | Bartha et al. | 430/323 |
| 5,741,624 A | * | 4/1998 | Jeng et al. | 430/321 |
| 6,200,906 B1 | * | 3/2001 | Batra et al. | 438/708 |
| 6,444,505 B1 | * | 9/2002 | Chen et al. | 438/149 |

FOREIGN PATENT DOCUMENTS

| | | |
|---|---|---|
| JP | 63-15472 | 1/1988 |
| JP | 0170452 | 10/1998 |
| JP | 2000-66240 | 3/2000 |

* cited by examiner

Primary Examiner—Nadine G. Norton
Assistant Examiner—Duy-Vu Deo
(74) Attorney, Agent, or Firm—Scully, Scott, Murphy & Presser

(57) ABSTRACT

The photolithography processes for connecting the first conductive film pattern, which is a lower layer such as a gate electrode of a TFT, to a second conductive film pattern, which is an upper layer such as a source/drain electrode of a TFT are reduced by utilizing laminated films and a resist pattern formed thereon having different film thicknesses. Laminated films constituting the source/drain electrode are formed by depositing films on an insulating substrate on which the first conductive film pattern is formed, and the resist pattern is formed on the top layer of the laminated films, and then utilizing the film thickness difference of the resist pattern and the film composition of the laminated films, the short circuited wiring between the gate electrode and the source/drain electrode for an Electro-Static-Discharge protection circuit of the active matrix substrate can be formed by less photolithography processes than that in the manufacturing of the conventional active matrix substrate.

10 Claims, 19 Drawing Sheets

MANUFACTURING METHOD OF ACTIVE MATRIX SUBSTRATE

BACKGROUND OF THE INVENTION

1. Field of the Invention

The present invention relates to a manufacturing method of a liquid crystal display panel which uses thin film transistors (TFTs), and in particular, to a manufacturing method of an active matrix substrate.

2. Description of the Prior Art

In an active matrix substrate which uses TFTs used for a liquid crystal display panel etc., and in particular, inverted stagger type TFTs as active elements, pairs of the above-described TFT and a corresponding liquid crystal to each TFT are arrayed in a matrix as pixels all over the substrate except a peripheral area of a glass substrate. Gate terminals each connecting with a drive IC, and data terminals (drain terminals) are provided on the peripheral area of the glass substrate. Furthermore, protection transistors against static electricity are connected to these terminal portion so as to perform the protection against overcurrent or overvoltage from the outside of the active matrix substrate as a measure against ESD (Blectro-Static-Discharge).

Hereinafter, the prior art will be described with reference to FIG. 2 that is a circuit diagram of an active matrix substrate. As shown in FIG. 2, plenty of gate terminals G and drain terminals D are formed in the periphery of the active matrix substrate. Gate wirings 401 including gate bus wirings and drain wirings 402 including data wirings and drain bus wirings are arrayed in a matrix toward the internal area of the active matrix substrate from the gate terminals G and drain terminals D respectively. ESD protection circuits 403 and 503 are formed adjacent to each gate terminal G and each drain terminal D.

Each of the ESD protection circuits 403 consists of two thin film transistors. In one TFT a gate electrode and a drain electrode are connected to a gate wiring 401. The source electrode is connected to a common wiring of a common terminal COM. The common wiring is simultaneously formed in the same layer as that of the drain wirings 402. On the other hand, the gate electrode and source electrode of another TFT are connected to the common wiring while its drain electrode is connected to the gate wiring 401.

Similarly, in one TFT constituting the ESD protection circuit 503, the gate electrode and drain electrode are connected to the drain wiring 402. The source electrode thereof is connected to a wiring of a dummy terminal. This wiring is simultaneously formed in the same layer as that of the gate wirings 401. The gate electrode and source electrode of another TFT constituting the ESD protection circuit 503 are connected to a wiring of the dummy terminal. The drain electrode thereof is connected to the drain wiring 402. The gate wiring 401 of the gate terminal G is connected to the gate electrode of a switching transistor 404 constituting a pixel. The drain wiring 402 of the drain terminal D is connected to the drain electrode of the switching transistor 404. In addition, the source electrode of this switching transistor 404 is connected to a transparent pixel electrode of a liquid crystal shown in FIG. 2. In this case, a vertical electric field is applied to the liquid crystal, and hence, the liquid crystal is called a TN (Twist Nematic) liquid crystal.

In an ESD protection circuit formed in a peripheral area of an active matrix substrate as described above, a TFT constituting the ESD protection circuit must have electric connection between two different conductive layers, one of which comprises a gate electrode, a gate bus wiring and a wiring of a dummy terminal, and the other of which comprises a drain electrode, a drain bus wiring and a wiring of a common terminal COM.

Next, a manufacturing method of an active matrix substrate having the electric connection will be described with reference to FIGS. 1(a) to 1(e).

FIGS. 1(a) to 1(e) are typical cross sectional views in the order of manufacturing process steps in the case where the connection of the gate electrode and drain electrode of a TFT is performed, the connection becoming indispensable as a measure against ESD.

As shown in FIG. 1(a), the gate electrode 406 is formed on the glass substrate 405, which is a transparent insulating substrate, by patterning a layer of metal such as chromium. Then, a gate insulation layer 407, an amorphous silicon film 408, and an n+amorphous silicon film 409 are deposited in order so that the gate electrode 406 may be covered by the gate insulation layer 407.

As shown in FIG. 1(b), a resist mask 410 is formed by photolithography technology, and the n+amorphous silicon film 409 and amorphous silicon film 408 are patterned by dry etching technology. Then, a semiconductor layer 411, which is an amorphous silicon layer, and an n+amorphous silicon layer 412 are formed.

The resist mask 410 is removed and a conductive film consisting of chromium or the like is deposited on the entire surface by sputtering.

As shown in FIG. 1(c), a resist mask 413 is formed and the metal conductive film is patterned into a predetermined shape by dry etching technology.

Thus, as shown in FIG. 1(c), the source electrode 414 and drain electrode 415 are formed. Then, the resist mask 413 is removed, and the n+amorphous silicon layer 412 is patterned by utilizing the source electrode 414 and drain electrode 415 as etching masks. Thus, a source ohmic layer 416 and a drain ohmic layer 417 are formed on an end portion of the semiconductor layer 411.

As shown in FIG. 1 (d), a passivation film 418 is deposited on the entire surface and a resist mask 419 is formed thereon, and contact holes 420 and 421 are formed in the passivation film 418 on the gate electrode 406 and drain electrode 415 by using etching technology respectively.

The resist mask 419 is removed, and as shown in Fig. 1(e), the gate electrode 406 and drain electrode 415 are electrically connected to each other by a transparent metal electrode 422 through the contact holes 420 and 421. Thus, as shown in FIG. 1(e), an inverted stagger type TFT with the gate electrode 406 and drain electrode 415 being electrically connected to each other is formed on the glass substrate 405.

When an active matrix substrate having ESD protection circuits is produced by using a conventional electric connection method as described above, at least five photolithography process steps are needed. Concerning photolithography process steps used in the active matrix substrate having ESD protection circuits the technology four photolithography process steps is shown in Japanese Patent Laid-Open No. 63-015472 as an example. In this publication, a semiconductor layer and a source/drain electrode of an inverted stagger type TFT, and a transparent metal electrode connected to the source/drain electrode is formed under a passivation film by using only three photolithography steps. But a method of forming contact holes in the passivation film is not described.

Currently, it is indispensable that an active matrix substrate for an LCD has to have an ESD protection circuit as a measure against the ESD. For this purpose, it is necessary to electrically connect a gate electrode or a gate bus wiring with a drain electrode (or source electrode) or a drain bus wiring through a contact hole in the active matrix substrate with TFT.

However, as described above, when using the conventional technology, manufacture the active matrix substrate having an ESD protection circuit needs at least five photolithography process steps. Therefore, the manufacturing process of the active matrix substrate having an ESD protection circuit needs one more photolithography step than that of the active matrix substrate having no ESD protection circuit.

Such increase in photolithography process steps brings about the reduction of a manufacturing yield of LCDs inevitably, and reduces productivity thereof. Then, the manufacturing cost of LCDs increases and reliability thereof is also lowered.

SUMMARY OF TEE INVENTION

An object of the present invention is to provide a new method for manufacturing an active matrix substrate having ESD protection circuits by using four photolithography process steps.

Another object of the present invention is to provide a method for forming reliable gate terminals and drain terminals. In addition, still another object of the present invention is to prevent damage at source/drain conductive film etching process from being given to a gate electrode or a gate bus wiring in a contact hole. In order to achieve the objects of the present invention, a manufacturing method of an active matrix substrate according to the present invention is a method of forming thin film transistors (TFT) on an insulating substrate as follows:

Films constituting a TFT are deposited in a laminated structure on an insulating substrate and a resist pattern having different film thicknesses is formed thereon. After that, as a first etching process, the laminated films are etched to form a predetermined pattern of the laminated films by using the resist pattern as an etching mask, and as a resist etching process, a thinner portion of the resist pattern is removed by etching the resist pattern to make a thicker portion of the resist mask remain as "a resist pattern left."

Subsequently, as a second etching process, the predetermined pattern of the laminated films is etched by using the resist pattern left as an etching mask.

The following shows an example of a fundamental structure of the present invention described above. A first form of the manufacturing method of an active matrix substrate according to the present invention includes following processes:

A first conductive film consisting of one conductive material is patterned to form a first conductive film pattern on an insulating substrate, and depositing in order an insulation layer, a semiconductor thin film, a semiconductor thin film for ohmic contact, and a second conductive film consisting of other conductive material to form laminated films on the insulating substrate and the first conductive film pattern. After that, a resist pattern having a second portion with a opening therein and a first portion thicker than the first portion is formed on the second conductive film and etching the laminated films by using the resist pattern as an etching mask to form a contact hole reaching a surface of the first conductive film pattern. Subsequently, the second portion of the resist pattern is removed by etching the resist pattern to make the first portion of the resist pattern remain as "a first portion left," and the second conductive film, the semiconductor thin film for ohmic contact and the semiconductor thin film are etched by using the first portion left as an etching mask to form a predetermined laminated pattern. Then, after the first portion left is removed, a second conductive film pattern of the predetermined laminated pattern and the first conductive film pattern are electrically connected to each other by forming a third conductive film pattern through the contact hole.

A second form of the manufacturing method of an active matrix substrate according to the present invention includes following processes:

A first conductive film consisting of one conductive material is patterned to form a first conductive film pattern on an insulating substrate, and depositing in order an insulation layer, a semiconductor thin film, a semiconductor thin film for ohmic contact, and a second conductive film consisting of other conductive material to form laminated films on the insulating substrate and the first conductive film pattern. After that, a resist pattern having a second portion with a opening therein and a first portion thicker than the first portion is formed on the second conductive film and etching the second conductive film to the semiconductor thin film of the laminated films by using the resist pattern as an etching mask to form a contact hole reaching a surface of the insulation layer. Subsequently, the second portion of the resist pattern is removed by etching the resist pattern to make the first portion of the resist pattern remain as "a first portion left," and the second conductive film is etched by using the first portion left as an etching mask to form a second conductive film pattern. Then, the semiconductor thin film for ohmic contact and the second conductive film are etched to form a laminated pattern of the second conductive film, the semiconductor thin film for ohmic contact and the second conductive film by using the first portion left and the second conductive film pattern as an etching mask, simultaneously etching the insulation layer to form a contact hole in the insulation layer reaching a surface of the first conductive film pattern. After the first portion left is removed, the second conductive film pattern of the laminated pattern and the first conductive film pattern are electrically connected to each other by forming a third conductive film pattern through the contact hole. A third form of the manufacturing method of an active matrix substrate according to the present invention includes following processes:

A first conductive film consisting of one conductive material is patterned to form a first conductive film pattern on an insulating substrate, and depositing in order an insulation layer, a semiconductor thin film, a semiconductor thin film for ohmic contact, a protective conduction film made of other conductive material and a second conductive film consisting of the conductive material to form laminated films on the insulating substrate and the first conductive film pattern. After that, a resist pattern having a second portion with a opening therein and a first portion thicker than the first portion is formed on the second conductive film and etching out at least top two films of the top three of the laminated films by using the resist pattern as an etching mask to form a contact hole reaching at least a surface of the semiconductor thin film for ohmic contact. Subsequently, the second portion of the resist pattern is removed by etching the resist pattern to make the first portion of the resist pattern remain as "a first portion left," and the second conductive film is etched by using the first portion left as an etching mask to reveal a surface of the protective conduction film. After the second conductive film is etched, the residual films remained in the contact hole after etching out at least top two films of the top three of the laminated films is etched and removed by using the first portion left and the protective conduction film as an etching mask to form a final contact hole in the insulation layer reaching a surface of the first conductive film pattern. Subsequently, the protective conduction film, the semiconductor thin film for ohmic contact and the semiconductor thin film are etched and removed by using the first portion left as an etching mask to form a second conductive film pattern of the second conductive film and the protective conduction film. Then, after the first portion left is removed, the second conductive film pattern and the first conductive film pattern are electrically connected to each other by forming a third conductive film pattern through the contact hole.

A fourth form of the manufacturing method of an active matrix substrate according to the present invention is a manufacturing method of an active matrix substrate that comprises a plurality of gate bus wirings and drain bus wirings arrayed in a matrix on an insulating substrate, a pixel having a TFT in each intersection area, gate terminals and drain terminals which are formed as end portions of gate bus wirings and as end portions of drain bus wirings with functions of receiving external signals respectively, and a protection circuit having TFTs to protect the pixel from the overvoltage or overcurrent of an external signal. The manufacturing method of the active matrix substrate includes following processes:

A first conductive film consisting of one conductive material is patterned to form a gate wiring and a gate electrode of a TFT on an insulating substrate, and depositing in order a gate insulation layer, a semiconductor thin film, a semiconductor thin film for ohmic contact, and a conductive film consisting of other conductive material for a source/drain conductive film to form laminated films on the insulating substrate, the gate wiring and the gate electrode. After that, a resist pattern having a second portion with a opening therein and a first portion thicker than the first portion is formed on the source/drain conductive film and etching the laminated films by using the resist pattern as an etching mask to form a contact hole reaching a surface of the first conductive film including the gate bus wirings and gate electrodes of TFTs constituting the protection circuit simultaneously formed with the gate bus wirings. Subsequently, the second portion of the resist pattern is removed by etching the resist pattern to make the first portion of the resist pattern remain as "a first portion left," and the source/drain conductive film, the semiconductor thin film for ohmic contact and the semiconductor thin film are etched and removed by using the first portion left as an etching mask to form a source/drain conductive film pattern. Then, after the first portion left is removed, a second conductive film is deposited on surfaces of the source/drain conductive film pattern and the first conductive film including the gate bus wirings and the gate electrodes of TFTs constituting the protection circuit through the contact holes. After that, the second conductive film is patterned to form a second conductive film pattern including a pixel electrode and using the second conductive film pattern as an etching mask, the source/drain conductive film pattern and the semiconductor thin film for ohmic contact are etched and removed to form drain bus wirings including a source/drain electrode simultaneously formed with the drain bus wirings. Finally, the source/drain conductive film pattern including the drain bus wirings and the source/drain electrode of TFT constituting the protection circuit are electrically connected to the first conductive film pattern including the gate bus wirings and the gate electrode of TFT constituting the protection circuit by the second conductive film pattern through contact holes.

BRIEF DESCRIPTION OF THE DRAWINGS

This above-mentioned and other objects, features and advantages of this invention will become more apparent by reference to the following detailed description of the invention taken in conjunction with the accompanying drawings, wherein.

DETAILED DESCRIPTION OF THE PREFERRED EMBODIMENTS

Figure 3A:
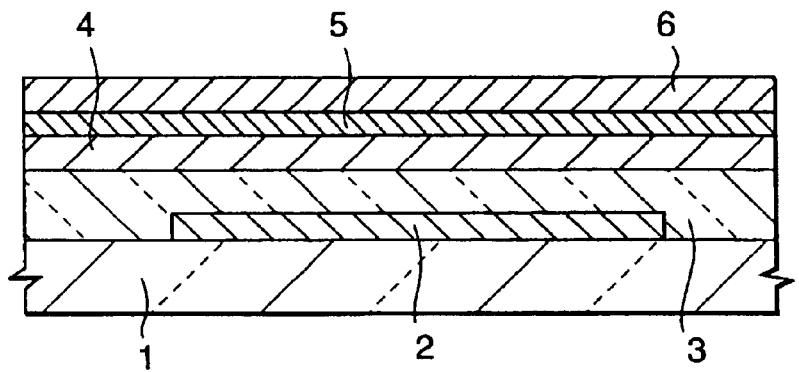
FIGS. 3(a) to 3(h) are cross sectional views of a manufacturing process in order of a TFT for explaining a first embodiment of the present invention.

A first embodiment of the present invention will be described with reference to FIG. 3. FIGS. 3(a) to 3(h) are cross sectional views of a manufacturing process in order of a TFT on an active matrix substrate for explaining characteristics of a manufacturing method according to the present invention;

As shown in FIG. 3(a), a first conductive film pattern 2 consisting of a first conductive layer is formed by patterning a Mo (molybdenum) conductive film on a glass substrate 1. Then, an insulation layer 3, an amorphous silicon film 4 which is a semiconductor thin film, and an n+type amorphous silicon film 5 which is a semiconductor thin film for ohmic contact are deposited in order covering the first conductive film pattern 2. Furthermore, a metal conductive film 6 consisting of Cr (chromium) or the like, which is a second conductive film (or source/drain conductive film), is deposited on the entire surface of the glass substrate 1 by sputtering.

Figure 3B:
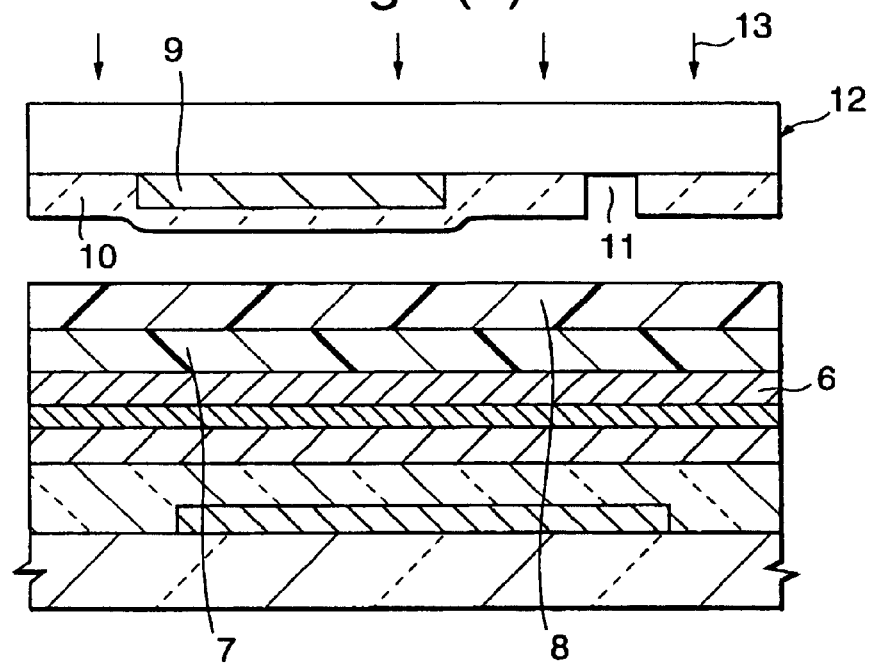

By using photolithography technology, as shown in FIG. 3(b), a lower resist film 7 and an upper resist film 8 are coated in order on the surface of the metal conductive film 6. Both the lower and upper resist films are positive photoresists, and thicknesses of the lower and upper resist films are 0.5 μm and 1.5 μm, respectively. Then, the exposure sensitivity of the lower resist film 7 is set to be lower than that of the upper resist film 8.

The upper resist film 8 and lower resist film 7 are exposed by an exposure light 13 through a reticle 12 as a photomask, which has a light shielding portion 9, a light half-transmitting portion 10, and a light transmitting portion 11 as shown in FIG. 3 (b). After this exposure, the laminated resist films are developed by a usual developing method.

An example of a photomask that has such a light shielding portion, a light half-transmitting portion and a light transmitting portion will be described. In the example shown in FIG. 3(b), the light shielding portion 9 consisting of, for example, chromium is formed in a predetermined pattern on the reticle 12. Then, the light half-transmitting portion 10 is formed by using halftone material, for example, a tungsten silicide. This light half-transmitting portion is formed so that several % to 50% of an amount of the exposure light is transmitted. The light transmitting portion 11 is an area where the chromium metal and halftone material are not formed.

Figure 3C:
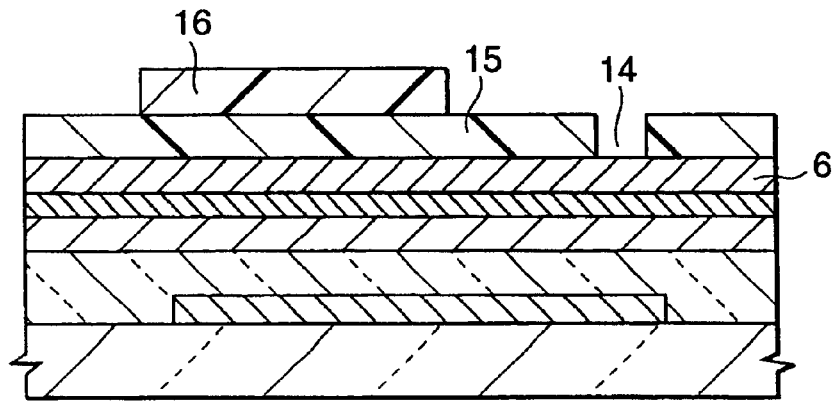

Furthermore, in an another example of a photomask that has a light shielding portion, a light half-transmitting portion and a light transmitting portion, the light shielding portion consisting of, for example, chromium is formed in a predetermined pattern on a photomask. The light half-transmitting portion is formed by using a chromium having chromium thickness thinner than that of the light shielding portion. In this case, an area in which a thin film portion formed by the chromium allows about half of an amount of an incident light to transmit. In this manner, as shown in FIG. 3(c), the first resist mask 15, which has an opening 14, and the second resist mask 16 are formed on the metal conductive film 6 by the one photolithography process. The opening 14 is formed as a transfer pattern in a place corresponding to the light transmitting portion 11 of the reticle 12.

Moreover, the second resist mask 16 is a transfer pattern of the light shielding portion 9 of the reticle 12, and consists of the upper resist film 8 and the lower resist film 7. The first resist mask 15 consists of the lower resist film 7 with low exposure sensitivity, as described above. The first resist mask 15 is formed in the process shown in FIG. 3(c) since the amount of an exposure light input to the lower resist film 7 decreases by using the photomask.

Figure 3D:
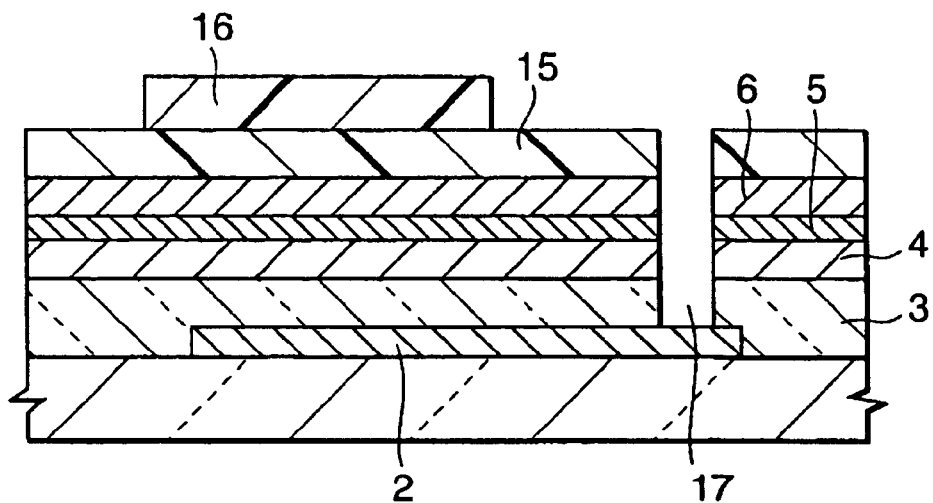
Figure 3E:
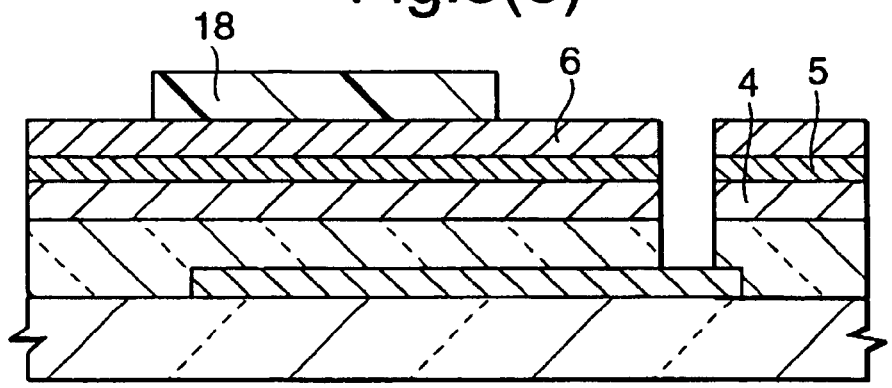
Figure 3F:
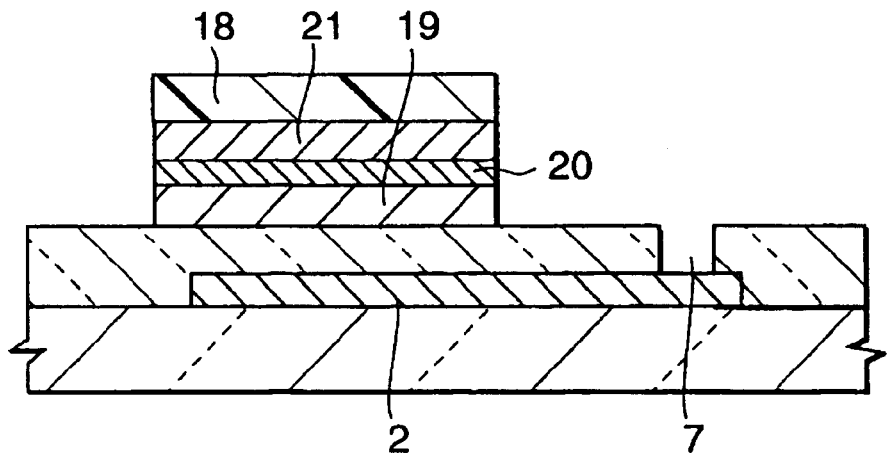

As shown in FIG. 3(d), laminated films consisting of the metal conductive film 6, n+type amorphous silicon film 5, amorphous silicon film 4, and insulation layer 3 are etched in order by using the first resist mask 15 and second resist mask 16 as etching masks. Thus, a contact hole 17 that reaches a surface of the first conductive film pattern 2 is formed. The metal conductive film 6 consisting of Cr is etched and removed by using chemical liquid for wet etching, which is obtained by mixing a perchloric acid with a dibasic cerium ammonium nitrate, and the laminated films except chromium are removed by reactive ion etching (RIB). Thus, after the formation of the contact hole 17 which reaches the surface of the first conductive film pattern 2, by executing the plasma excitation of a mixed gas of $O_2$ and $CF_4$, ions or radicals, i.e., active species, of these gases are formed, and the first resist mask 15 and second resist mask 16 are etched back by anisotropic etching. As shown in FIG. 3(e), a third resist mask 18 is formed by this dry etching. In this etchback, since the resist mask is etched by anisotropic dry etching, the second resist mask 16 is not side-etched. That is, the distortion of the size of the third resist mask 18 from that of the second resist mask 16 is scarcely seen. The metal conductive film 6, n+type amorphous silicon film 5, and amorphous silicon film 4 are etched and removed by using the etching technology where the third resist mask 18 is used as an etching mask. Thus, a semiconductor film pattern 19 that is an amorphous silicon layer, an n+type amorphous silicon film pattern 20, and a second conductive film pattern 21 are formed. During the etching process, the first conductive film pattern 2 is exposed in the contact hole 17. However, since the first conductive film pattern 2 and metal conductive film 6 consist of different metals from each other, the first conductive film pattern 2 is free from being etched.

Figure 3G:
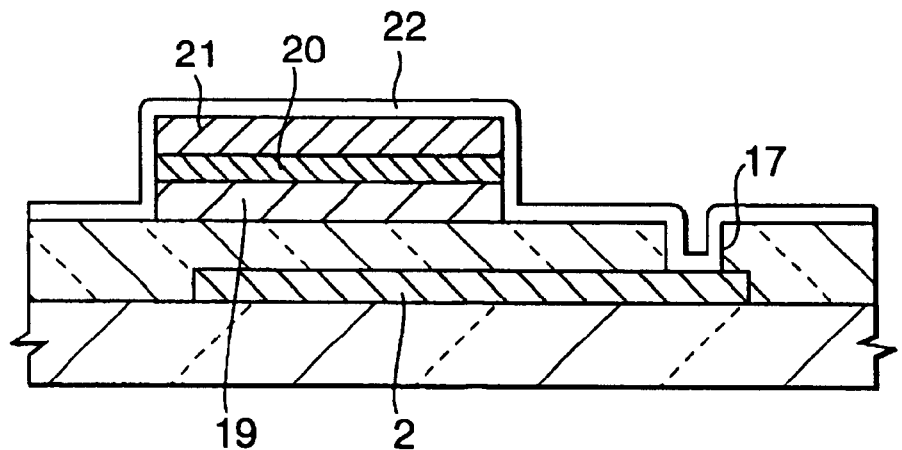

The third resist mask 18 is removed and a transparent electrode film 22 is deposited on the entire surface of the glass substrate 1 by sputtering, as shown in FIG. 3(g). The transparent electrode film 22 is an ITO film. This transparent electrode film 22 directly covers the second conductive film pattern 21, and is connected to the first conductive film pattern 2 through the contact hole 17.

Figure 3H:
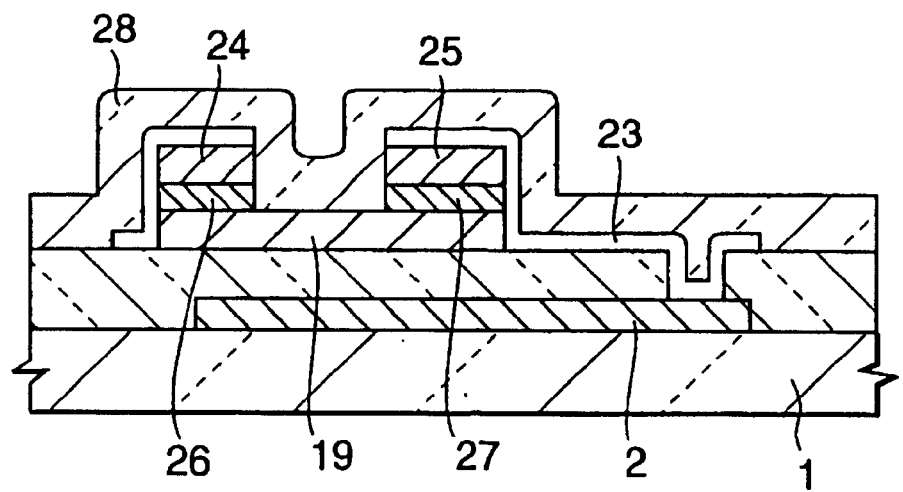

As shown in FIG. 3(h), the transparent electrode film 22 is etched to form a predetermined pattern of a transparent electrode 23 by using photolithography technology and dry etching technology. Furthermore, the second conductive film pattern 21 and n+type amorphous silicon film pattern 20 are etched and removed in order by using this transparent electrode 23 as an etching mask. Thus, a source electrode 24 and a drain electrode 25 are formed, and a source ohmic layer 26 and a drain ohmic layer 27 are formed on an end portion of the semiconductor film pattern 19.

A passivation film 28 is deposited on the entire surface of the glass substrate 1. Thus, an inverted stagger type TFT of the present invention where the first conductive film pattern 2 and the drain electrode 25 are electrically connected to each other through the transparent electrode 23 is formed on a glass substrate 1.

The embodiment is a case where the first conductive film pattern 2 and the metal conductive film 6 which constitutes the second conductive film pattern 21 including a source electrode and a drain electrode consist of different metals from each other. For such metals to be applied to this invention, the present inventor confirmed that metals for the first conductive film pattern and the second conductive film pattern are preferably selected from Cr, Ti (titanium)/Al (aluminum), Mo, and W (tungsten), and an alloy of Mo and W. Thus, in the present invention, an inverted stagger type TFT where the first conductive film pattern 2 and the drain electrode 25 are electrically connected to each other through the transparent electrode 23 can be formed by four photolithography processes. As is described in detail later, such TFT constitutes an ESD protection circuit of an active matrix substrate.

In the present invention, since manufacturing process is reduced, the manufacturing yield of LCDs improves and productivity increases. Then, the manufacturing cost of LCDs substantially decreases and reliable manufacturing of TFTs is easily realized.

A second embodiment of the present invention will be described with reference to FIG. 4 and FIGS. 3(g) and 3(h). FIGS. 4(a) to 4(h) are cross sectional views in order of manufacturing process steps according to the second embodiment of the present invention. The major difference of the second embodiment from the first embodiment is that each of the first conductive film pattern and the second conductive film pattern consists of a same metal. In the second embodiment, the same reference numerals will be assigned to the same parts as those described in the first embodiment.

Figure 4A:
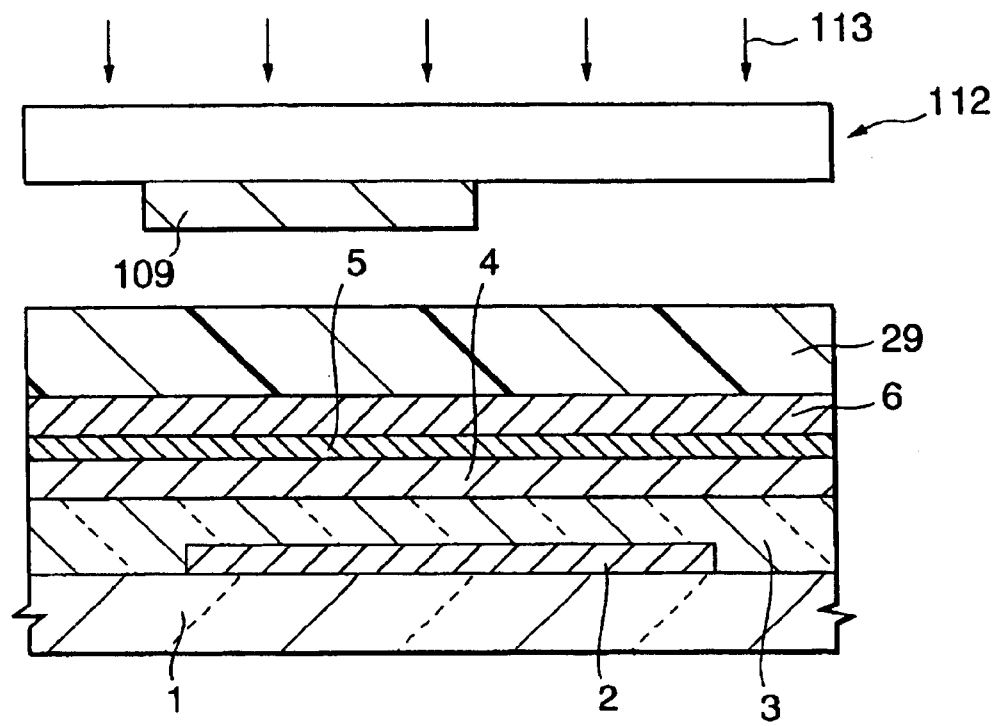
FIGS. 4(a) to 4(h) are cross sectional views of a manufacturing process in order of a TFT for explaining a second embodiment of the present invention.

As shown in FIG. 4(a), the first conductive film pattern 2 is formed by patterning Cr film on a glass substrate 1. Then, similarly as in the first embodiment described, an insulation layer 3, an amorphous silicon film 4, a n+type amorphous silicon film 5, and a metal conductive film 6 consisting of Cr are deposited in order covering the first conductive film pattern 2.

By using the photolithography technology, as shown in FIG. 4(a), a resist film 29 of 1.5 μm thick is formed on a surface of the metal conductive film 6. The resist film 29 is a single positive photoresist film.

Figure 4B:
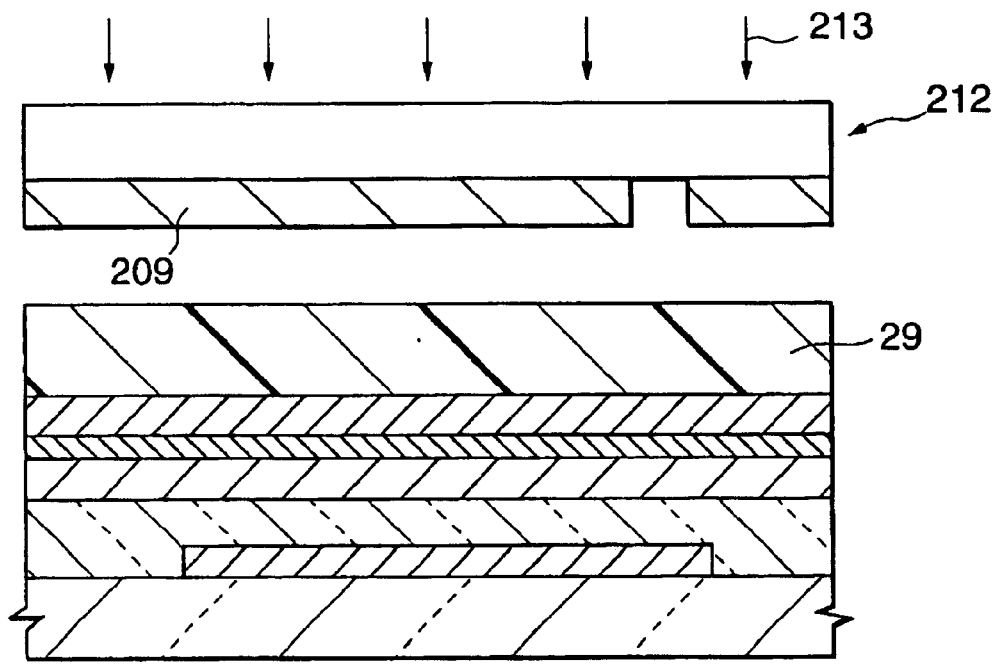
Figure 4C:
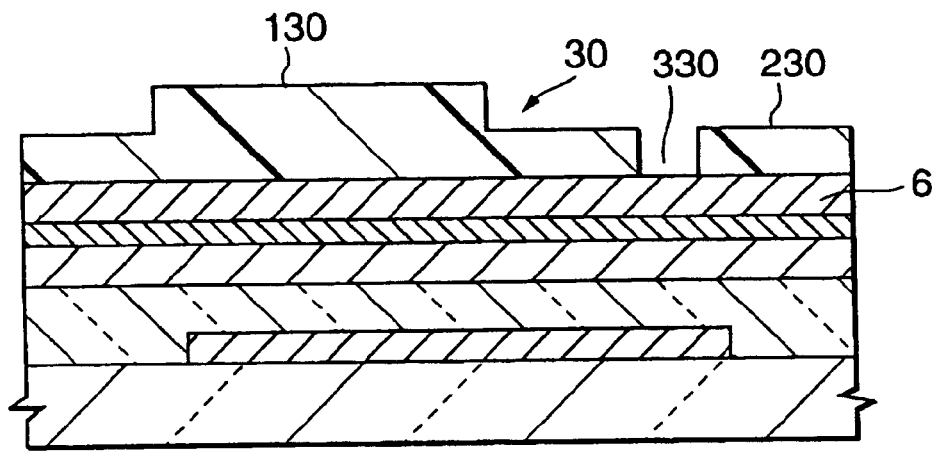

Then, the resist film 29 is exposed by a first exposure light113 through the reticle 112 as a photomask, which has a light shielding portion 109 as shown in FIG. 4(a). Subsequently, the resist film 29 is exposed by a second exposure light 213 through the reticle 212 as a photomask, which has a light shielding portion 209 as shown in FIG. 4(b). Two consecutive pattern transfer steps are performed on the resist film 29 by using two kinds of photomasks as described above. It is preferable that an amount of the first exposure light is smaller than that of the second exposure light. After two consecutive exposures described above, the resist film 29 is developed by using a usual developing method. As shown in FIG. 4(c), after the development of this resist film 29, a resist mask 30 having different film thicknesses is formed. That is, as shown in FIG. 4(c), a second portion 230 of the resist mask 30 with an opening 330 and a first portion 130 of the resist mask 30 thicker than the second portion 230 are formed on the second conductive film 6.

The first portion 130 of the resist mask 30 is a transfer pattern of the light shielding portion 109 of the reticle 112 described in FIG. 4(a). As the first portion 130 of the resist mask 30, which corresponds to the area of the light shielding portion 109, receives no exposure light through the two consecutive exposures shown in FIG. 4(a) and FIG. 4(b), the positive photoresist remains completely in the area of the first portion 130.

Figure 4D:
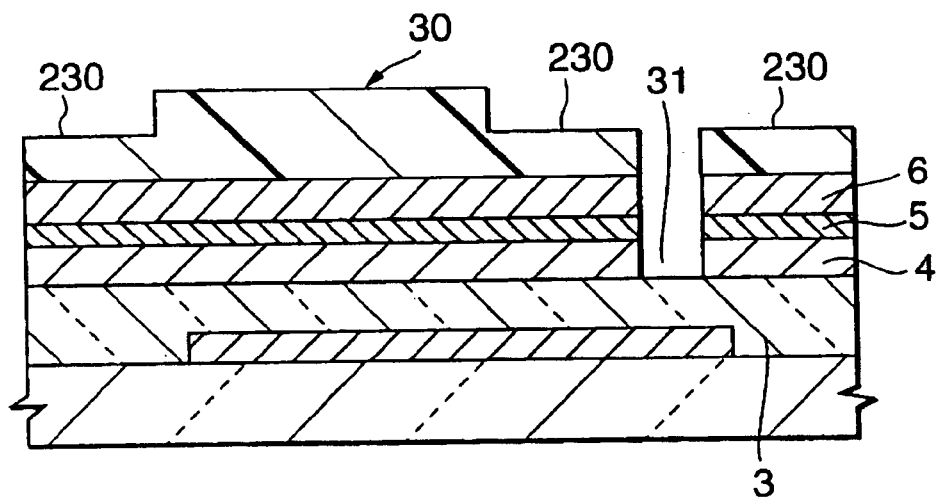

On the other hand, the opening 330 is a transfer pattern defined by the light shielding portion 209 in the reticle 112 described in FIG. 4(b), and hence the positive photoresist corresponding to the light shielding portion 209 is completely removed. The second part 230 of the resist mask 30 is exposed only by the first exposure light 113 to form a resist film pattern having about 0.7 μm thickness and corresponds to the area of insufficient amount of exposure As shown in FIG. 4(d), by using the resist mask 30 as an etching mask, the second conductive film 6, n+type amorphous silicon film 5, and amorphous silicon film 4 in the opening portion 330 are etched and removed in order, and thus an opening 31 is formed.

The second conductive film 6 is wet-etched by using as an etchant a chemical liquid where dibasic cerium ammonium nitrate and a perchloric acid are mixed. Then, the n+type amorphous silicon film 5 and amorphous silicon film 4 are dry-etched by RIE using a mixed gas of $Cl_2$ and HBr that is plasma-excited as a reactive gas. During this dry etching process, the insulation layer 3 consisting of a silicon nitride film is hardly etched.

Figure 4E:
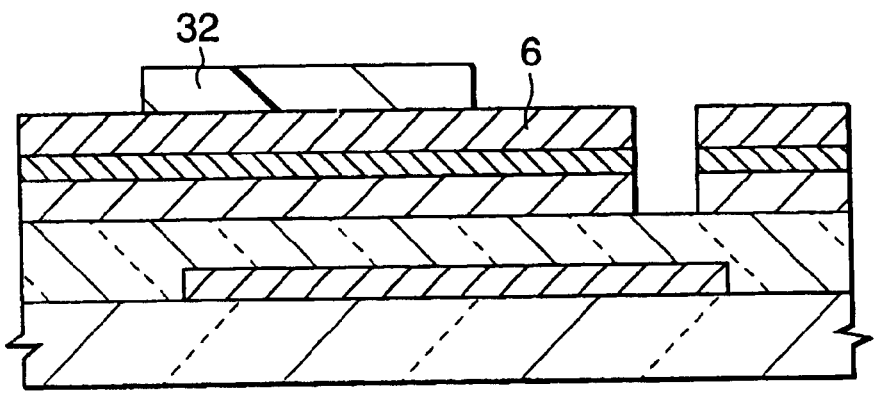

A mixed gas of $O_2$ and $CF_4$ is plasma-excited, and the resist mask 30 is anisotropically etched back. In the etchback by this dry etching, the second portion 230 of the resist mask 30 described in FIG. 4(c) is removed. Thus, as shown in FIG. 4(e), the remaining resist mask 32 is formed on the second conductive film 6.

Figure 4F:
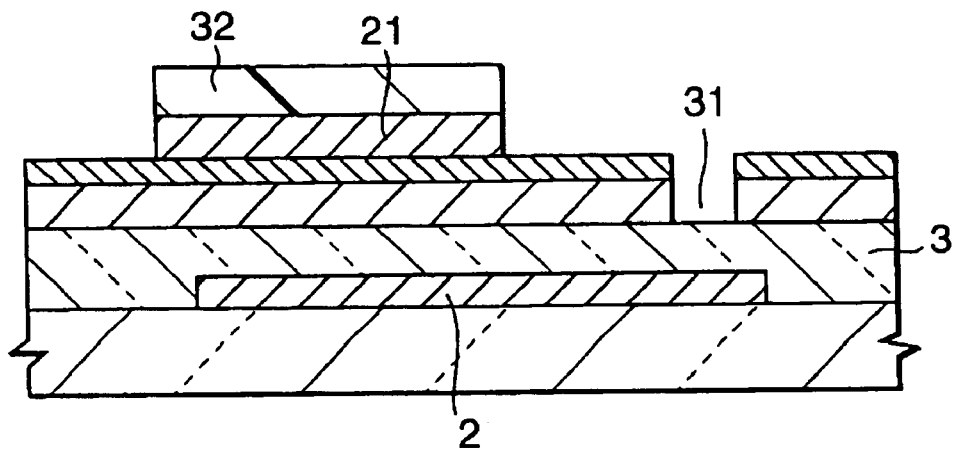

As shown in FIG. 4(f), by using the remaining resist mask 32 as an etching mask, the second conductive film 6 is wet-etched and a second conductive film pattern 21 is formed. As the second conductive film 6 is a Cr film, the same etchant as that of the chemical liquid of a mixture of a dibasic cerium ammonium nitrate and a perchloric acid is applied to the etching. During this etching process, since the first conductive film pattern 2 consisting of the same metal, Cr, as that of the second film pattern is covered with the insulation layer 3 in the opening 31, the first conductive film pattern 2 is free from being etched.

Figure 4G:
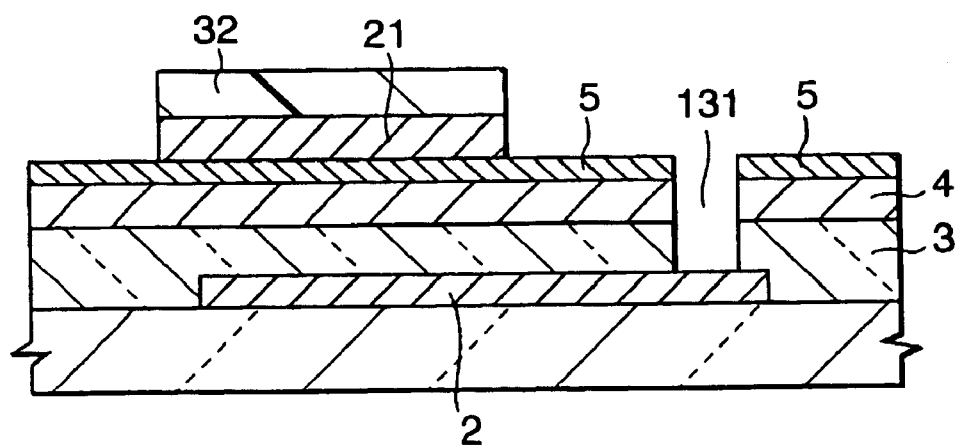

As shown in FIG. 4(g), the insulation layer 3 in the opening 31 is dry-etched and removed by RIB using the n+type amorphous silicon film 5 or amorphous silicon film 4 as an etching mask to form a contact hole 131 reaching a surface of the first conductive film pattern 2. During the above-mentioned etching, the second conductive film pattern 21 is protected by the remaining resist mask 32. As a reactive gas, a mixed gas of CHF3 and a very small amount of $O_2$, which is plasma-excited is used. During this etching process, the surface of the first conductive film pattern 2 is hardly etched.

Figure 4H:
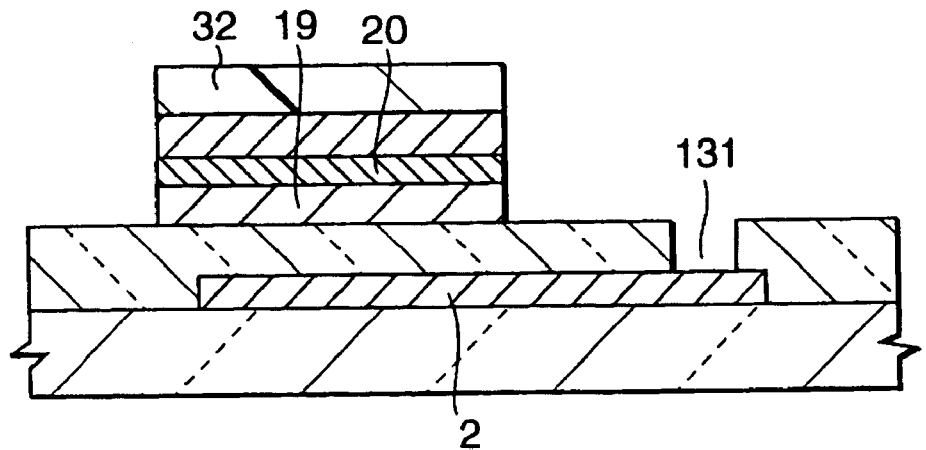

As shown in FIG. 4(h), the n+type amorphous silicon film 5 and amorphous silicon film 4 are dry-etched and removed by using the remaining resist mask 32 as an etching mask. Thus, a semiconductor film pattern 19 consisting of an amorphous silicon layer and an n+type amorphous silicon film pattern 20 are formed. During this etching process, the first conductive film pattern 2 is exposed in the contact hole 131. Since a mixed gas of $Cl_2$ and HBr, which is plasma-excited, as a reactive gas is used, the surface of the first conductive film pattern 2 is hardly etched during this etching process.

The subsequent process is completely same as that of the first embodiment. That is, referring to FIG. 3 (g), a transparent electrode film 22 is deposited on the second conductive film pattern 21 and the first conductive film pattern 2 connecting thereto through the contact hole 131. Thus, finally, an inverted stagger type TFT where a first conductive film pattern and a drain electrode are electrically connected to each other through a transparent electrode is formed on the glass substrate 1.

The second embodiment is the case that the same metal, Cr, is applied to the second conductive film 6 constituting a source electrode and a drain electrode, and the first conductive film pattern 2. As a metal for both the first conductive film pattern and the second conductive film pattern to be applied in the second embodiment, the present inventor can propose to use Mo, W or an alloy of Mo and W.

The same features as that of the first embodiment are effected in the second embodiment. Since the same metal is used for the second conductive film pattern and the first conductive film pattern, both manufacturing yield of LCDB and productivity are improved further.

A third embodiment of the present invention will be described with reference to FIG. 5 and FIGS. 3(g), 3(h), 4(a), and 4(b). This embodiment can be shown in cross sectional views that are nearly same as those of the second embodiment in the manufacturing process. The major difference of this embodiment from the second embodiment is that, in the case of each of a first conductive film pattern and a second conductive film pattern consisting of a same metal, a protective conductive film is formed under the second conductive film pattern. In the third embodiment, the same reference numerals will be assigned to the same parts as those described in the second embodiment.

As shown in FIG. 5 (a), the first conductive film pattern 2 is formed by patterning Mo metal on a glass substrate 1. Then, by applying the similar process as described in the second embodiment, a insulation layer 3, an amorphous silicon film 4, a n+type amorphous silicon film 5, a protective conductive film 33 consisting of Cr, and a metal conductive film 106 consisting of Mo are deposited in on the glass substrate 1.

Figure 5A:
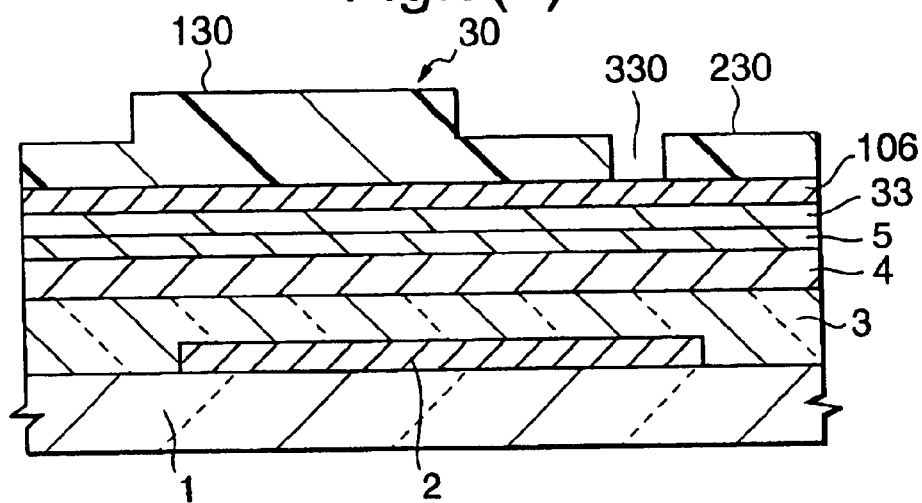
FIGS. 5(a) to 5(f) are cross sectional views of a manufacturing process in order of a TFT for explaining a third embodiment of the present invention.

By applying the same manufacturing method described in FIGS. 4(a) and 4(b), a resist mask 30 having different thicknesses is formed on the second conductive film 106. That is, as shown in FIG. 5(a), a second portion 230 of the resist mask 30 with an opening 330 and a first portion 130 of the resist mask 30 thicker than the second portion 230 are formed on the second conductive film 6.

Figure 5B:
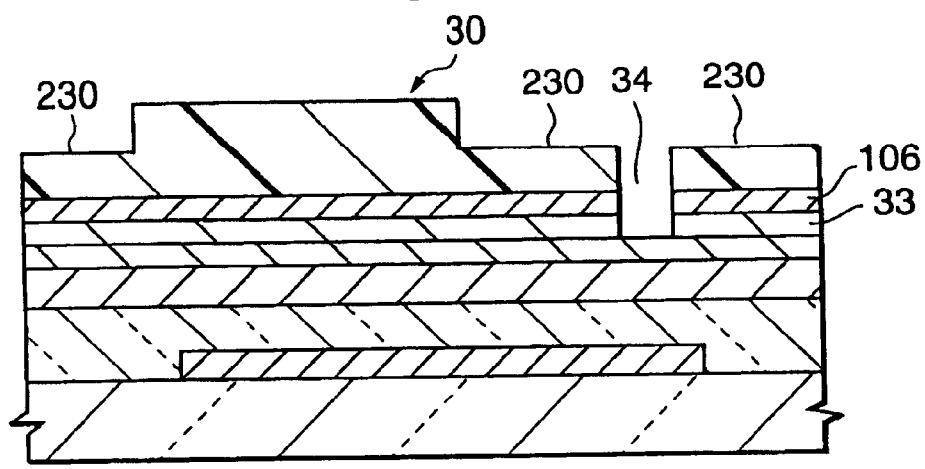

As shown in FIG. 5(b), an opening 34 is formed by etching the second conductive film 106 and protective conductive film 33 in the opening 330 using the resist mask 30 as an etching mask. The metal conductive film 106 and protective conductive film 33 are sequentially dry-etched by RIB using a mixed gas of $Cl_2$, $O_2$, and He that are plasma-excited as a reactive gas.

Figure 5C:
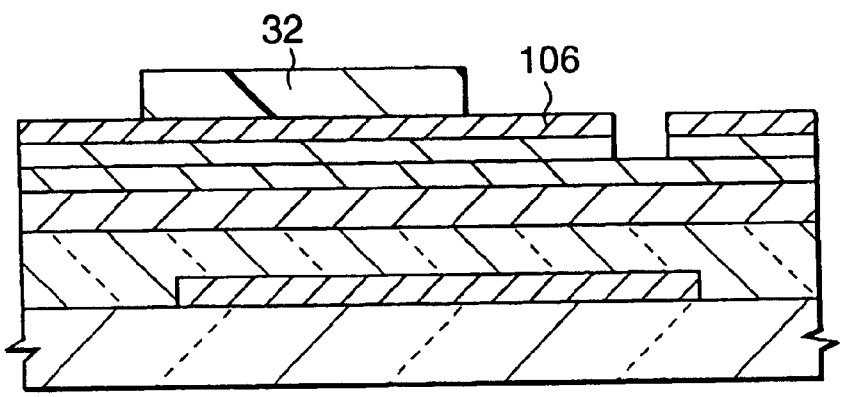

The resist mask 30 is anisotropically etched back by using a mixed and plasma-excited gas of $O_2$ and $CF_4$. In this manner, as shown in FIG. 5(c), a remaining resist mask 32 is formed on the second conductive film 106.

Figure 5D:
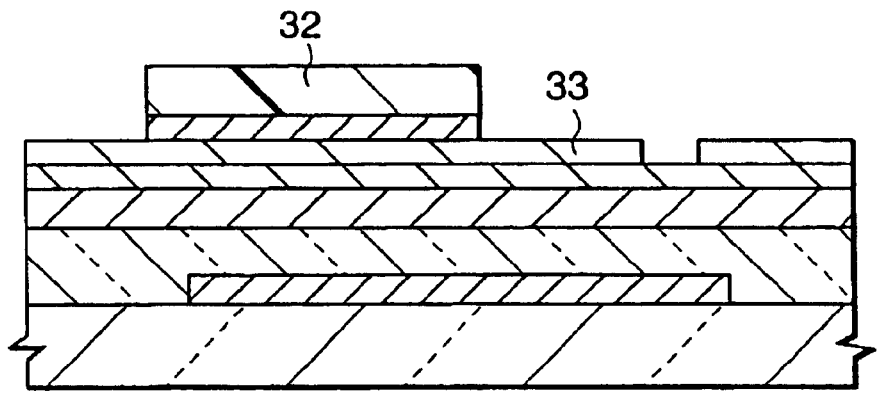

As shown in FIG. 5(d), by using the remaining resist mask 32 as an etching mask, the second conductive film 106 is wet-etched. To selectively remove the second conductive film 106 consisting of Mo, mixed chemical liquid of a phosphoric acid, a nitric acid and an acetic acid is used as an etchant. During this etching process, the protective conductive film 33 consisting of Cr is free from being etched.

Figure 5E:
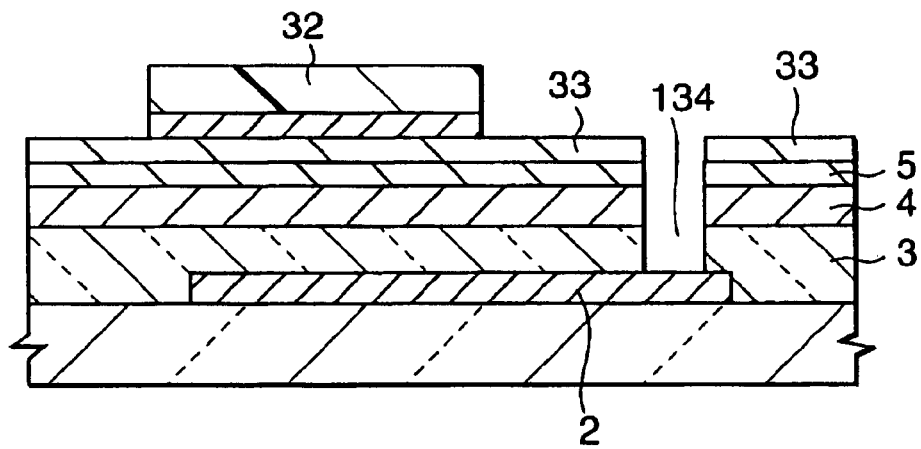

As shown in FIG. 5(e), using the remaining resist mask 32 and protective conductive film 33 as etching masks, a contact hole 134 to reach a surface of the first conductive film pattern 2 is formed by dry-etching (RIE) the n+type amorphous silicon film 5, amorphous silicon film 4, and insulation layer 3, with.

Figure 5F:
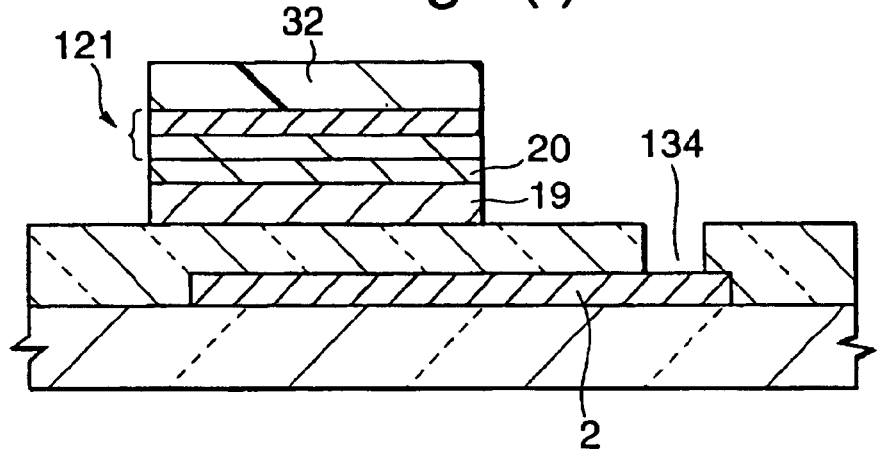

As shown in FIG. 5(f), using the remaining resist mask 32 as an etching mask, the protective conductive film 33 is wet-etched and removed to form a second conductive film pattern 121 consisting of Mo and Cr. Mixed chemical liquid of a dibasic cerium ammonium nitrate and a perchloric acid is used as an etchant. Furthermore, the n+type amorphous silicon film 5 and amorphous silicon film 4 are etched and removed.

Thus, a semiconductor film pattern 19 consisting of an amorphous silicon layer, an n+type amorphous silicon film pattern 20, and a second conductive film pattern 121 are formed. During the etching process although the first conductive film pattern 2 is exposed in the contact hole 134, the surface of the first conductive film pattern 2 is hardly etched.

The subsequent process is completely same as in the first embodiment. That is, as already mentioned in the explanation for FIGS. 3(g) and 3(h), a transparent electrode film 22 that directly covers the second conductive film pattern 121 and connects to the first conductive film pattern 2 through the contact hole 134 is deposited on the glass substrate 1. Thus, finally, an inverted stagger type TFT where the first conductive film pattern and the drain electrode are electrically connected to each other through the transparent electrode is formed on the glass substrate 1.

The third embodiment is the case that the same metal, Mo, is applied to the second conductive film 106 constituting a source electrode and a drain electrode, and the first conductive film pattern 2. As a metal for both the first conductive film pattern 2 and the second conductive film 106 to be applied in the third embodiment, the present inventor can propose to use Cr, W or an alloy of Mo and W. However, in such cases, it is necessary to form a protective conductive film consisting of different metal from that of the second conductive film 106. In addition, the first conductive film pattern can be composed of laminated metal films. In this case, the upper film material of the first conductive film pattern coincides with the film material constituting the second conductive film 106.

The same features as that of the first embodiment are effected in the third embodiment. In addition to the above features, in this embodiment, as the second conductive film pattern 121 consists of laminated conductive films, the resistance of the second conductive film pattern 121 becomes smaller than that of the second conductive film pattern in the first embodiment.

As described in the first to third embodiments, metals such as Mo, W and an alloy of Mo and W can be used for the second conductive film constituting a source electrode and a drain electrode or the first conductive film pattern. However, moisture resistance of metal such as Mo and W is lower than that of Cr. Therefore, it is necessary to provide gate terminals G and drain terminals D with moisture resistive structure in the periphery of the active matrix substrate as described in FIG. 2.

Figure 6A:
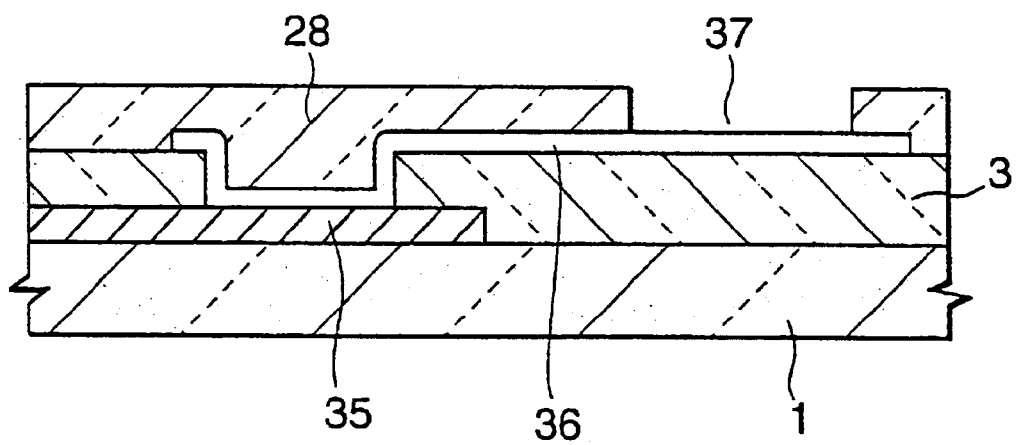
FIGS. 6(a) and 6(b) are cross sectional views of gate terminal portions of the present invention and conventional technology respectively for comparison.
Figure 6B:
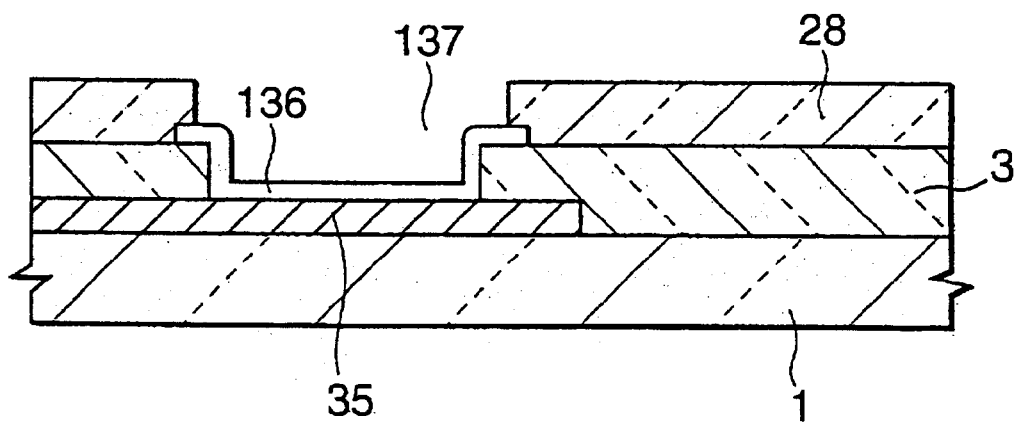
Figure 7A:
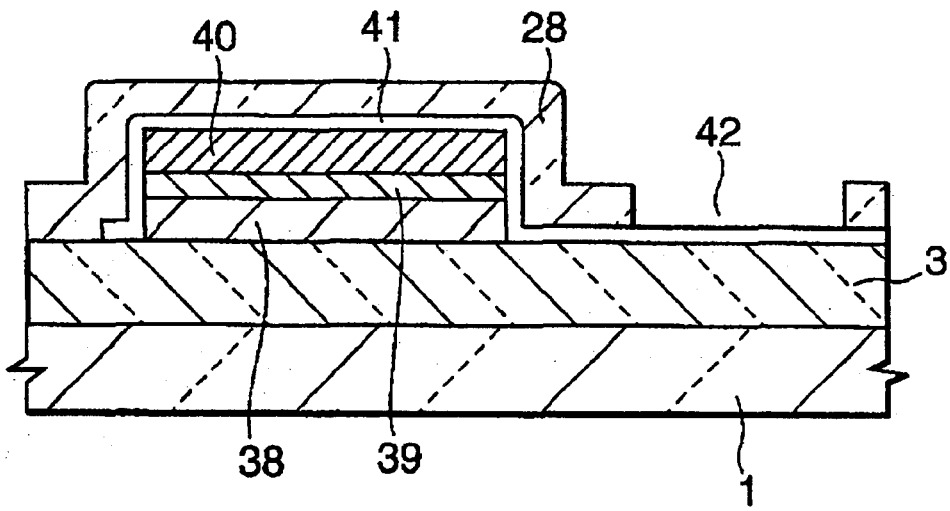
FIGS. 7(a) and 7(b) are cross sectional views of drain terminal portions of the present invention and conventional technology respectively for comparison.
Figure 7B:
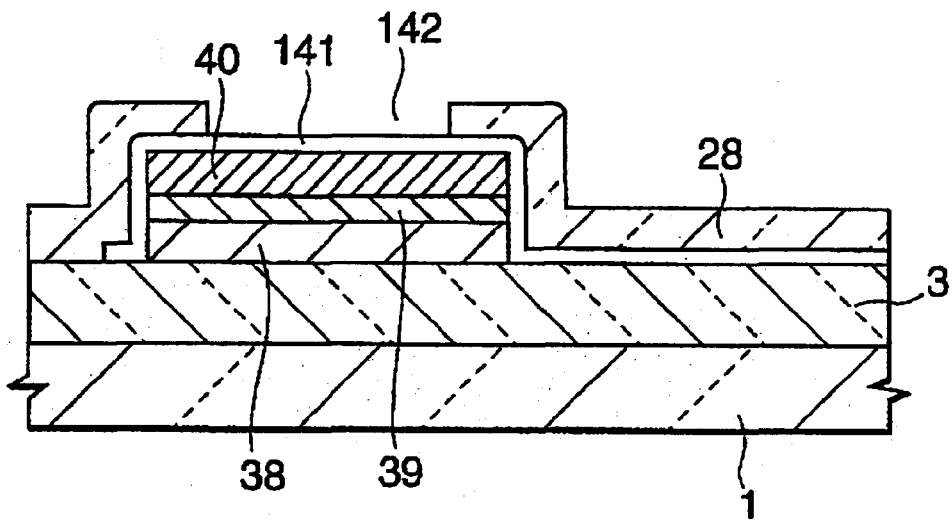

A fourth embodiment of the present invention will be described below with reference to FIGS. 6(a), 6(b), 7(a) and 7(b). In this embodiment, a manufacturing method for a gate terminal G and a drain terminal D when using a low moisture resistive metal to form a gate electrode or drain electrode of a TFT will be described. FIGS. 6(a) and 6(b) are cross sectional views of a gate terminal G, and FIGS. 7(a) and 7(b) are cross sectional views of a drain terminal D. The same reference numerals will be assigned to the same parts as those in the first to third embodiments.

As shown in FIG. 6(a), a gate wiring 35 consisting of Mo is formed on a glass substrate 1. The gate wiring 35 is formed as a part of a first conductive film pattern 2 described in the first and second embodiments. Then, as described in the first embodiment, the insulation layer 3 is deposited on the entire surface. Next, a predetermined area of the insulation layer 3 on the gate wiring 35 is opened to form an opening in the insulation layer 3, and a transparent gate terminal electrode 36 is formed on the insulation layer 3 so that the transparent gate terminal electrode 36 is connected to the gate wiring 35 through the opening of the insulation layer 3 and extends on the insulation layer 3 from the opening to be connected with an external device. Finally, a passivation film 28 is deposited on the entire surface, and an opening 37 for a gate terminal is formed.

As described above, the gate terminal G is covered completely by the passivation film 28 and therefore when the transparent gate terminal electrode 36 consists of a moisture resistive metal, ITO, the gate wiring 35 becomes to have very high moisture resistance.

For comparison, a sectional view of a gate terminal G by using a conventional technique is shown in FIG. 6(b). The same reference numerals are assigned to the same parts as those in the prior embodiments of the present invention.

As shown in FIG. 6(b), the gate wiring 35 consisting of Mo is formed on the glass substrate 1, and the insulation layer 3 is deposited on the entire surface. Then, an opening is formed in a predetermined area of the insulation layer 3 on the gate wiring 35 located in a peripheral region of the active matrix substrate. After that, a transparent gate terminal electrode 136 is formed directly on the gate wiring 35 through the opening of the insulation layer 3. Subsequently, a passivation film 28 is deposited on the entire surface, and an opening 137 for gate terminal is formed on the transparent gate terminal electrode 136.

In this conventional manufacturing method, when moisture enters the opening 137 from outside toward the gate wiring 35, the gate wiring 35 is corroded finally by the moisture since the moisture path to the gate wiring 35 is so short (in this case, the film thickness of the transparent gate terminal electrode 36) compared with that in the structure shown in FIG. 6(a).

On the other hand, in the structure shown in FIG. 6(a), as the moisture entrance is located at the opening 37 far from the opening of the insulation layer 3 on the gate wiring 35 compared with the structure shown in FIG. 6(b), the gate wiring 35 is almost free from moisture corrosion.

A drain terminal structure of the present invention is shown in FIG. 7(a). As shown in FIG. 7(a), an insulation layer 3 is deposited on the entire surface of a glass substrate 1. Next, as described in the first to the third embodiments, a semiconductor film pattern 38, an n+type amorphous silicon film pattern 39, and second conductive film pattern 40 are formed in laminated films structure on the insulation layer 3. The second conductive film pattern consists of Mo. The semiconductor film pattern 38, the n+type amorphous silicon film pattern 39, and the second conductive film pattern 40 constitute a drain wiring including a drain bus line.

Then, a transparent drain terminal electrode 41 is formed on the insulation layer 3 covering the laminated films so that the transparent drain terminal electrode 41 is connected to the drain wiring 40 and extends on the insulation layer 3 from the laminated films to be connected with an external device. Finally, a passivation film 28 is deposited on the entire surface, and an opening 42 for a drain terminal is formed in the passivation film 28.

As described above, when the drain wiring 40 consists of Mo having lower moisture resistance, the transparent drain terminal electrode 41 consisting of a moisture resistive metal, ITO, covers the drain wiring 40 being connected thereto and in addition the drain wiring 40 is covered completely by the passivation film 28. Thus, the gate wiring 40 becomes to have very high moisture resistance.

For comparison, a sectional view of a drain terminal by using a conventional technique is shown in FIG. 7(b). The same reference numerals are assigned to the same parts as those in the prior embodiments of the present invention.

As shown in FIG. 7(b), the drain wiring 40 consisting of Mo is formed as an uppermost layer of laminated films of the drain wiring 40, the n+type amorphous silicon film pattern 39 and the semiconductor film pattern 38, on the glass substrate 1, and a transparent drain terminal electrode 141 is formed covering the laminated films. Subsequently, a passivation film 28 is deposited on the entire surface, and then an opening 142 is formed in the passivation film 28 on the transparent drain terminal electrode 141 located in a peripheral region of the active matrix substrate.

In this conventional manufacturing method, when moisture enters the opening 142 from outside toward the drain wiring 40, the drain wiring 40 is corroded finally by the moisture since the moisture path to the drain wiring 40 is so short (in this case, the film thickness of the transparent drain terminal electrode 141) compared with that in the structure shown in FIG. 7(a).

On the other hand, in the structure shown in FIG. 7(a), as the moisture entrance is located at the opening 42 far from the drain wiring 40 compared with the structure shown in FIG. 7(b), the drain wiring 40 is almost free from moisture corrosion. The manufacturing method of the active matrix substrate having an ESD protection circuit is concretely explained regarding a terminal portion, the ESD protection circuit and a pixel with reference to FIG. 2. After the explanation, it will be clarified that the manufacturing method of the active matrix substrate according to the present invention is realized by four photolithography processes.

Figure 1A:
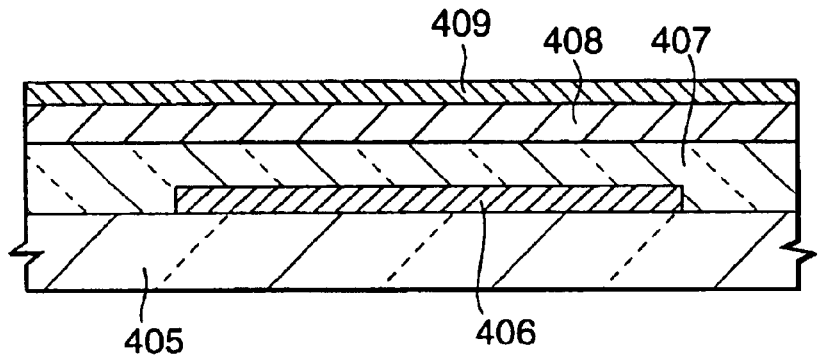
FIGS. 1(a) to 1(e) are cross sectional views of a manufacturing process in order of a TFT for explaining conventional technology.
Figure 1B:
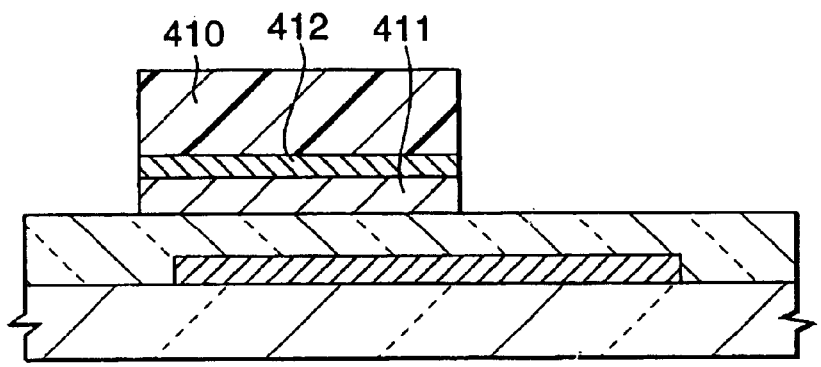
Figure 1C:
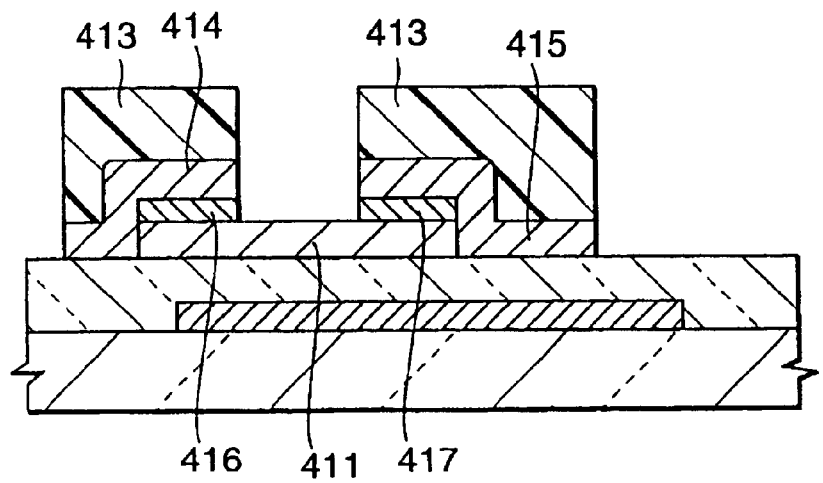
Figure 1D:
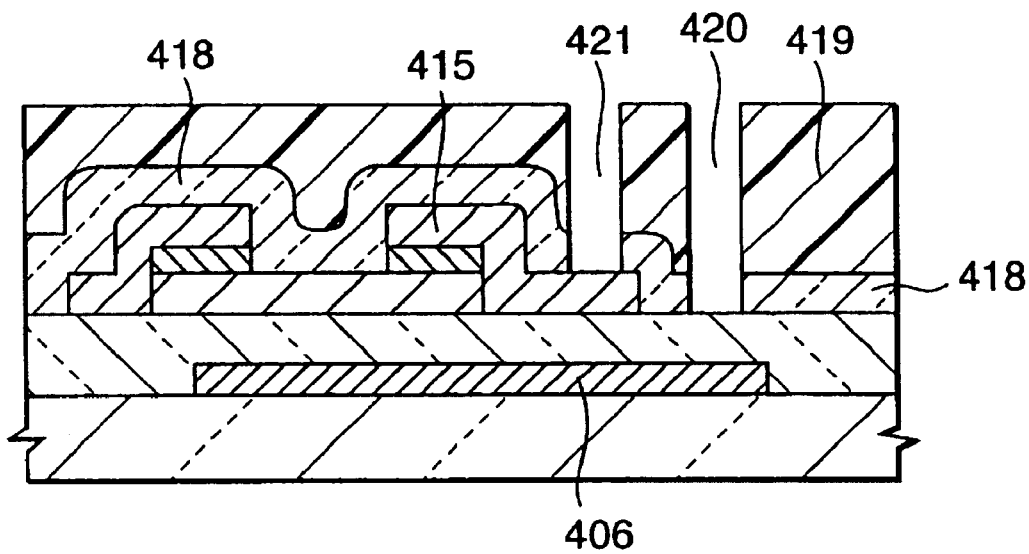
Figure 1E:
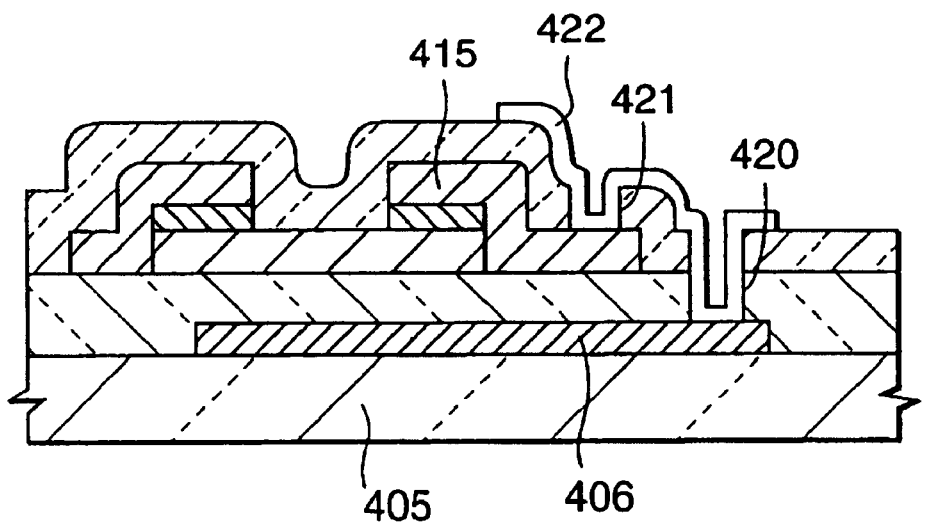
Figure 2:
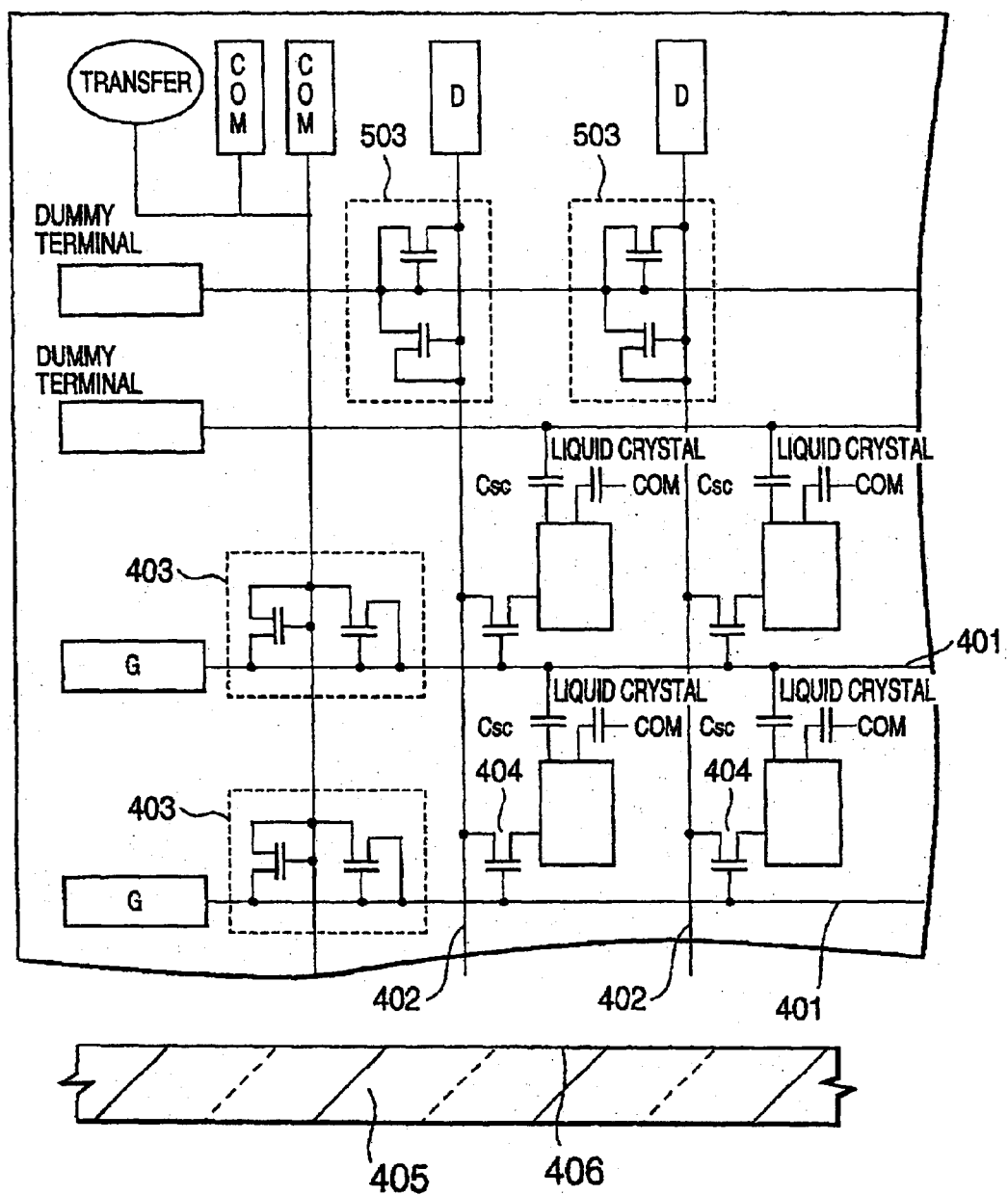
FIG. 2 is a plan view for explaining circuits, wirings, and terminals on an active matrix substrate for a liquid crystal display.
Figure 8:
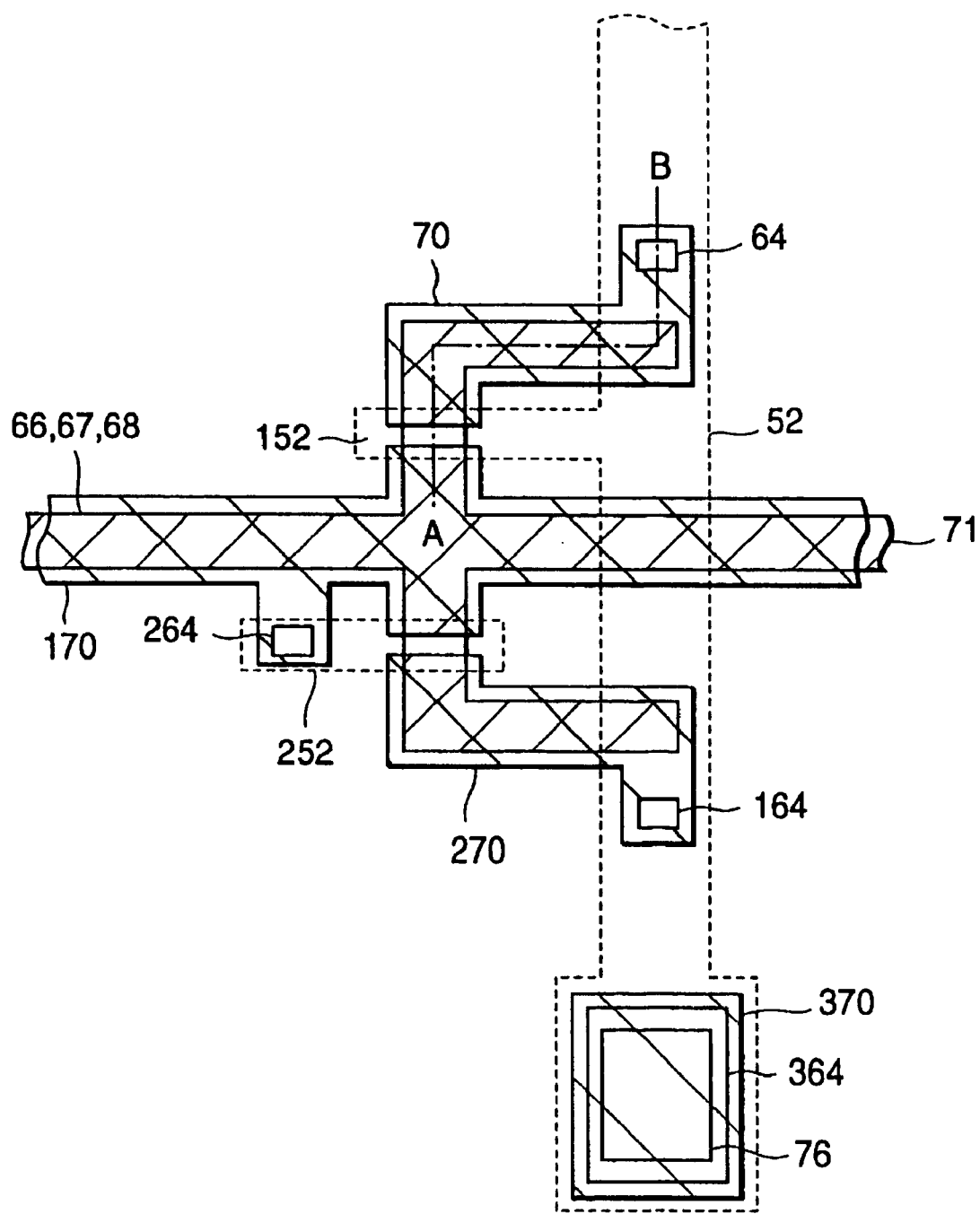
FIG. 8 is a plan view of a protection circuit and a gate terminal portion for explaining a concrete example of the present invention.

FIG. 8 is a plan view of the gate terminal G and ESD protection circuit 403 that are described in FIG. 2. Slanted lines are used for explaining parts for better understanding. In addition, FIGS. 9(a) to 9(g) are cross sectional views of manufacturing process steps in order of a TFT which constitutes an BSD protection circuit along the line A–B shown in FIG. 8. Hereinafter, this embodiment will be described with reference to FIGS. 8 and 9.

Figure 9A:
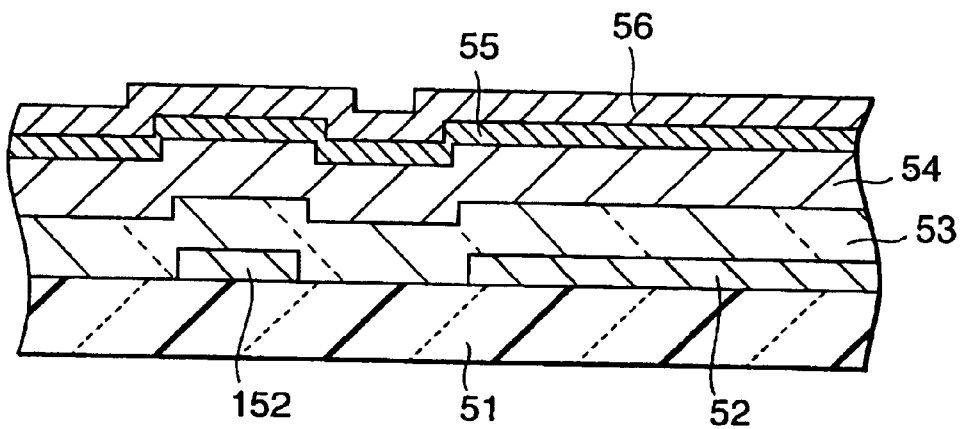
FIGS. 9(a) to 9(g) are cross sectional views of a manufacturing process in order of a TFT in the protection circuit.

After patterning a Cr conductive film by using a resist mask formed in a first photolithography process, as shown in FIG. 9(a), a gate wiring 52 including a gate bus wiring and a gate electrode 152 is formed on a glass substrate 51. The film thickness of the gate wiring 52 including the gate electrode 152 is about 200 nm.

Then, covering the gate wiring 52 including the gate electrode 152 on the glass substrate 51, a gate insulation layer 53 consisting of a silicon nitride film of 500 nm thickness, an amorphous silicon film 54 consisting of a semiconductor thin film of about 300 nm thickness, an n+type amorphous silicon film 55 consisting of a semiconductor thin film for ohmic contact of about 50 nm thickness, and a Mo film 56 consisting of a conductive film for a source and a drain of 300 nm thickness are deposited in order on the glass substrate 51.

Figure 9B:
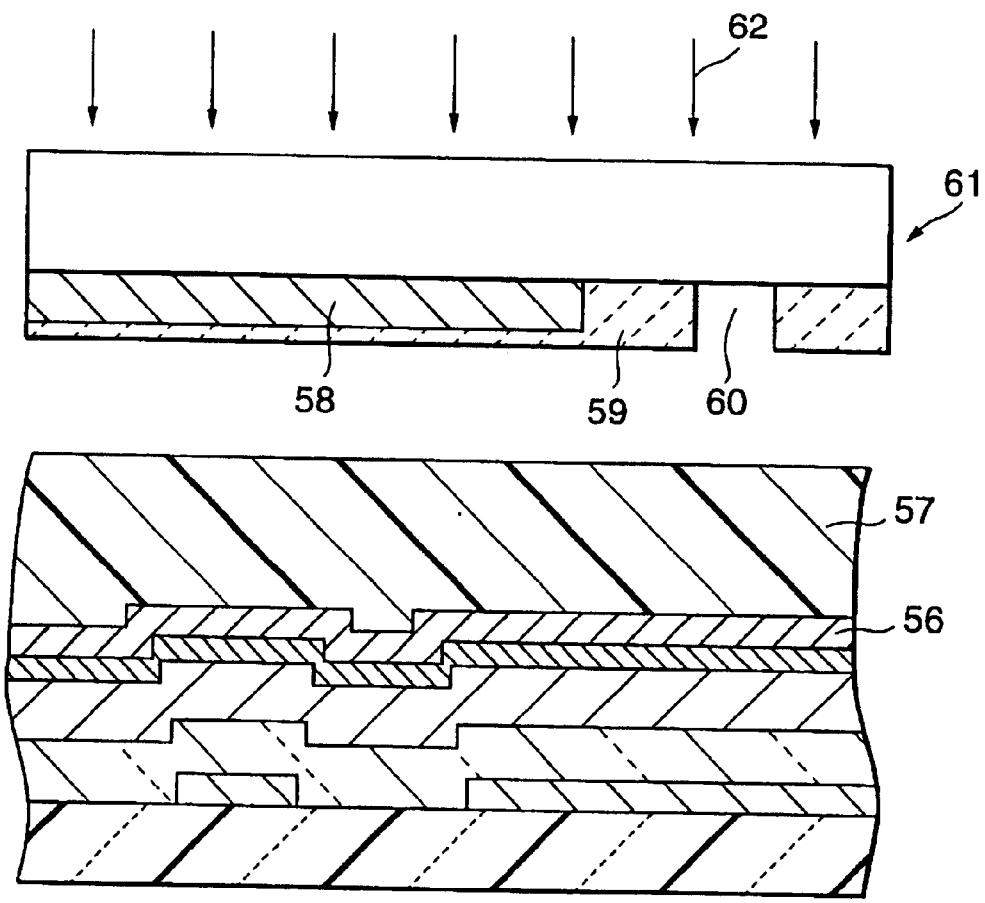

In a second photolithography process, as shown in FIG. 9(b), a resist film 57 of 2 μm film thickness is formed by a spin coating method on the metal conductive film 56. The resist film 57 is a positive photoresist. Then, the resist film 57 is exposed by an exposure light beam 62 through a reticle 61 as a photomask, which has a light shielding portion 58, a light half-transmitting portion 59, and a light transmitting portion 60, as shown in FIG. 9 (b). After this exposure, the resist film 57 is developed by a usual developing method.

Figure 9C:
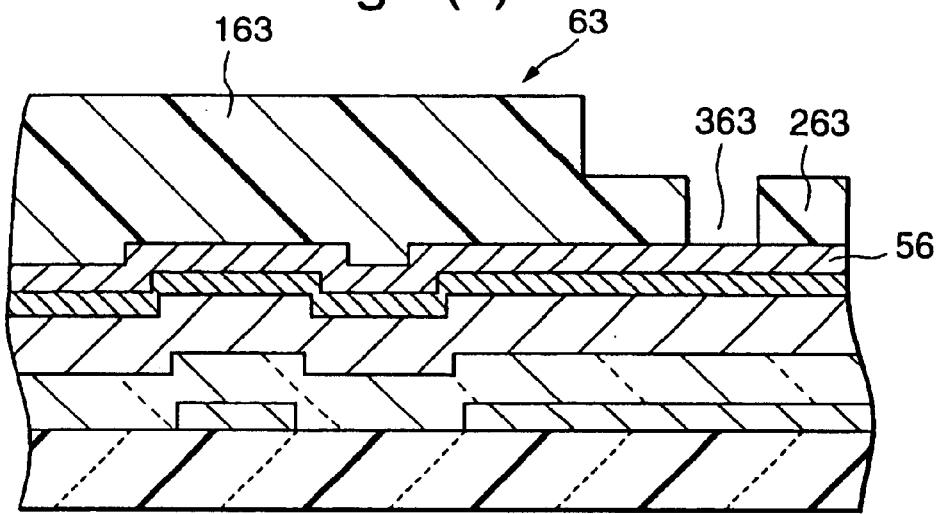

As is already explained in the first, second, and third embodiments, a resist mask 63 having different film thicknesses is formed (FIG. 9(c)). That is, as shown in FIG. 9(c), a first portion 163 of the resist mask, a second portion 263 of the resist mask thinner than the first portion 163, and an opening 363 having no resist film are formed on the second conductive film 56.

Figure 9D:
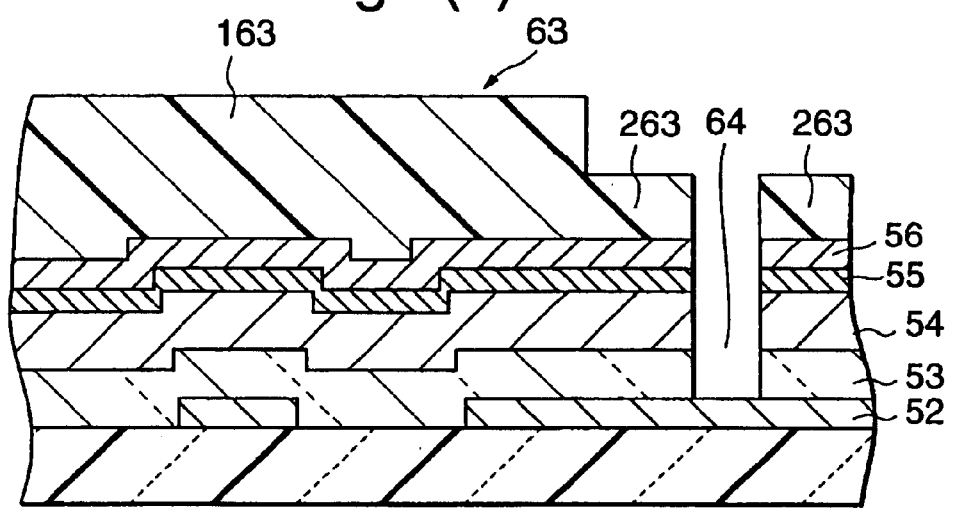

As shown in FIG. 9(d), by using the resist mask 63 as an etching mask, the second conductive film 56, n+type amorphous silicon film 55, amorphous silicon film 54, and gate insulation layer 53 are etched and removed in order. Thus, a contact hole 64 that reaches a surface of the gate wiring 52 is formed in the gate insulation layer 53. The second conductive film 56 consisting of Mo is etched by wet etching using the mixed chemical liquid of a phosphoric acid, a nitric acid and an acetic acid as an etchant, and the material films other than the second conductive film 56 are etched by RIB. That is, the n+type amorphous silicon film 55 and amorphous silicon film 54 are dry-etched by RIE using a mixed gas of $SF_6$, HCl, and He that are plasma-excited, and the gate insulation layer 53 is dry-etched by using a mixed gas of $CF_4$, $CHF_3$, and $O_2$ that are plasma-excited.

Figure 9E:
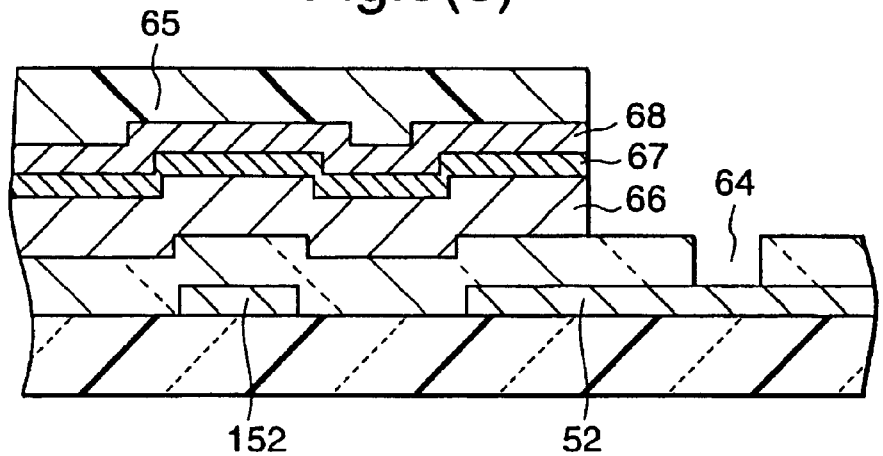

After the contact hole 64 reaching the gate wiring 52 is formed as described above, a mixed gas of $O_2$ and $CF_4$ is plasma-excited, and the resist mask 63 is etched back by anisotropic etching. After this etchback, the second part 263 of the resist mask is removed, and then a remaining resist mask 65 is formed by etching the first portion 163 of the resist mask 63. Subsequently, as shown in FIG. 9(e), by using this remaining resist mask 65 as an etching mask, the second conductive film 56, n+type amorphous silicon film 55, and amorphous. silicon film 54 are etched again in order and removed.

Figure 9F:
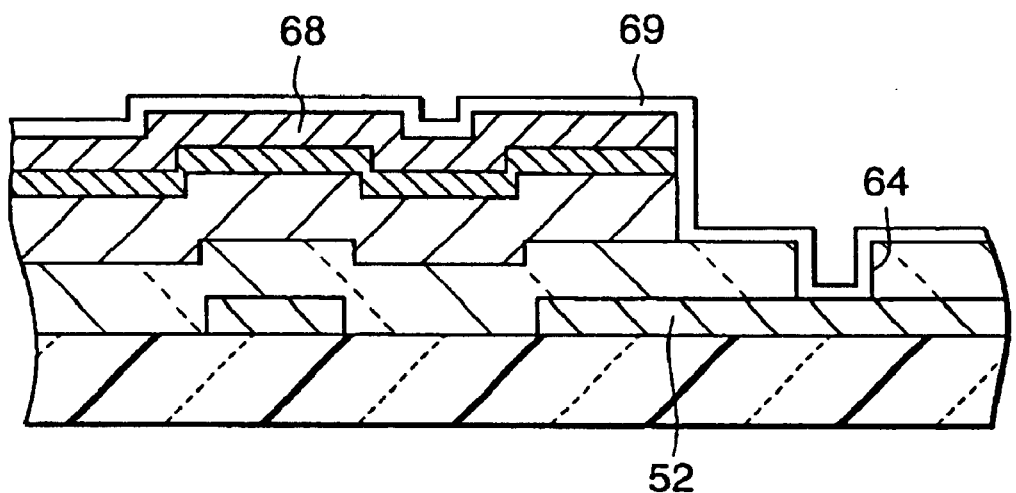

Thus, a semiconductor film pattern 66 consisting of an amorphous silicon layer, an n+type amorphous silicon film pattern 67, and a second conductive film pattern 68 are formed at the upper portion of the gate electrode 152. These semiconductor film pattern 66, n+type amorphous silicon film pattern 67 and second conductive film pattern 68 have a plane pattern indicated by the slanted lines from upper right to lower left as shown in FIG. 8. The remaining resist mask 65 is removed and a transparent electrode film 69 is deposited on the entire surface of the glass substrate 51 by sputtering, as shown in FIG. 9(f). The transparent electrode film 69 is an ITO film. This transparent electrode film 69 directly covers the metal conductive layer 68, and is connected to the gate wiring 52 through the contact hole 64.

Figure 9G:
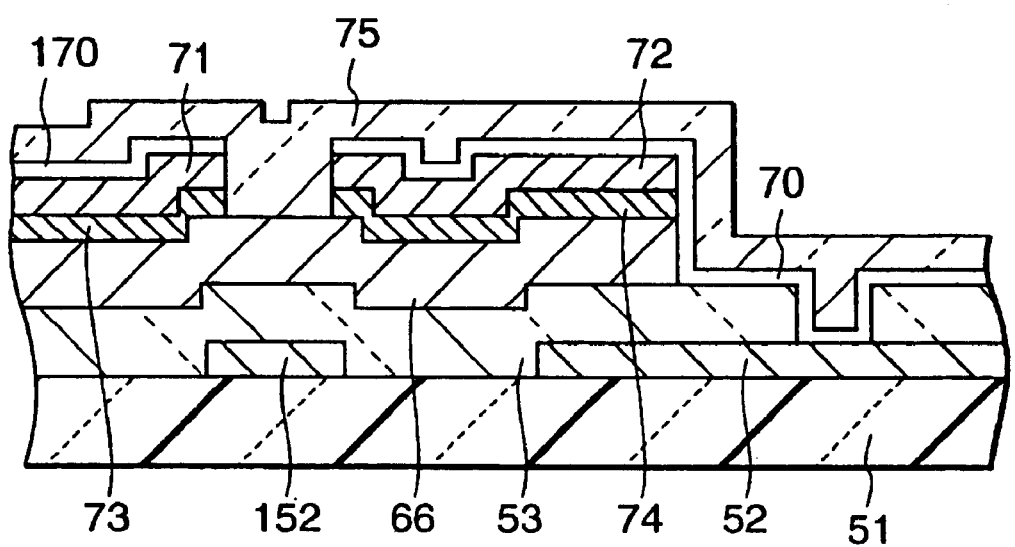

By etching and removing the electrode film 69 in a third photolithography process, as shown in FIG. 9(g), transparent electrodes 70 and 170 are formed into a predetermined pattern. The electrode film 69 is wet-etched by using mixed chemical liquid of an aqua regia, a chloride ferric, and a hydrochloric acid as an etchant. As shown in FIG. 8, transparent electrodes 270 and 370 are also formed by this etching. Hereinafter, in particular, the transparent electrode 370 is called a transparent gate terminal electrode 370.

As shown in FIG. 8, the transparent electrode 70 is connected to the gate wiring 52 through the contact hole 64, the transparent electrode 170 is connected to the gate electrode 252 through the contact hole 264, and the transparent electrode 270 is connected to the gate wiring 52 through the contact hole 164. In addition, the transparent gate terminal electrode 370 is connected to a gate terminal of an end portion of the gate wiring 52 through the contact hole 364.

Furthermore, the second conductive film pattern 68 and the n+type amorphous silicon film pattern 67 are etched in order and removed by using these transparent electrodes as etching masks. In this manner, as shown in FIG. 9(g), source/drain electrodes 71 and 72 are formed, and further, ohmic patterns 73 and 74 are formed in end portions of the semiconductor film pattern 66 by removing the n+type amorphous silicon film pattern 67 between source /drain electrodes 71 and 72.

A passivation film 75 is deposited on the whole surface of the glass substrate 51. Thus, finally, an inverted stagger type TFT whose source/drain electrode 72 is connected to the gate wiring 52 through the transparent electrode 70 is formed on the glass substrate 51. In addition to the source/drain electrodes 71 and 72, the inverted stagger type TFT comprises the gate electrode 152, gate insulation layer 53, and semiconductor film pattern 66.

Other than the inverted stagger type TFT whose gate is the gate electrode 152, as shown in the plan view of Fig. 8, another inverted stagger type TFT whose gate is the gate electrode 252 having source/drain electrode 71 being electrically connected to the gate electrode 252 through the transparent electrode 170 is formed on the glass substrate 51. Simultaneously, another source/drain electrode of this TFT is connected to the gate wiring 52 through the contact hole 164 by way of the transparent electrode 270. Furthermore, the source/drain electrode 71 is a common wiring of the common terminal COM described in FIG. 2. The common wiring consisting of a second conductive film is formed simultaneously with a drain bus wiring described later in the explanation for manufacturing of a pixel.

Through a fourth photolithography process, as shown in FIG. 8, an opening 76 for the gate terminal is formed in the passivation film 75 on the transparent gate terminal electrode 370.

As for the drain terminal D and ESD protection circuit 503, which are described in FIG. 2, are formed basically in the same way as described in FIGS. 8 and 9. A dummy wiring of dummy terminals described in FIG. 2 is formed simultaneously with the gate wiring 52. That is, the dummy wiring consisting of the first conductive film is formed with the gate bus wiring simultaneously.

As described above, according to the present invention, by using four photolithography processes, a terminal portion and an ESD protection circuit can be formed on an active matrix substrate.

In the fourth embodiment, the source/drain electrode and gate wiring including the gate electrode consist of different metals and the manufacturing process is fundamentally same as that in the first embodiment. In the fourth embodiment, when the source/drain electrode and gate wiring including the gate electrode consist of a same metal, the manufacturing process may be subject to that of the second or third embodiment.

As for the structure of gate terminal in the fourth embodiment, although the transparent gate terminal electrode 370 is to be formed as shown in FIG. 6(a), instead of this structure, a laminated structure of semiconductor film pattern 19, n+type amorphous silicon film pattern 20 and second conductive film pattern 21 as shown in FIG. 3(g) is also available for a gate terminal electrode. That is, the gate wiring 35 in FIG. 6(a) is connected to the second conductive film pattern 21 of the laminated structure shown in FIG. 3(g) through transparent electrode. As for the structure of drain terminal in the fourth embodiment, although the transparent drain terminal electrode is to be formed as shown in FIG. 7(a), instead of this structure, the opening portion structure of the transparent drain terminal electrode indicated by numeral 42 can be formed as shown in FIG. 6(b). In this case, the gate wiring 35 shown in FIG. 6(b) has to be electrically isolated from other gate wirings and used only for a drain terminal.

Figure 10:
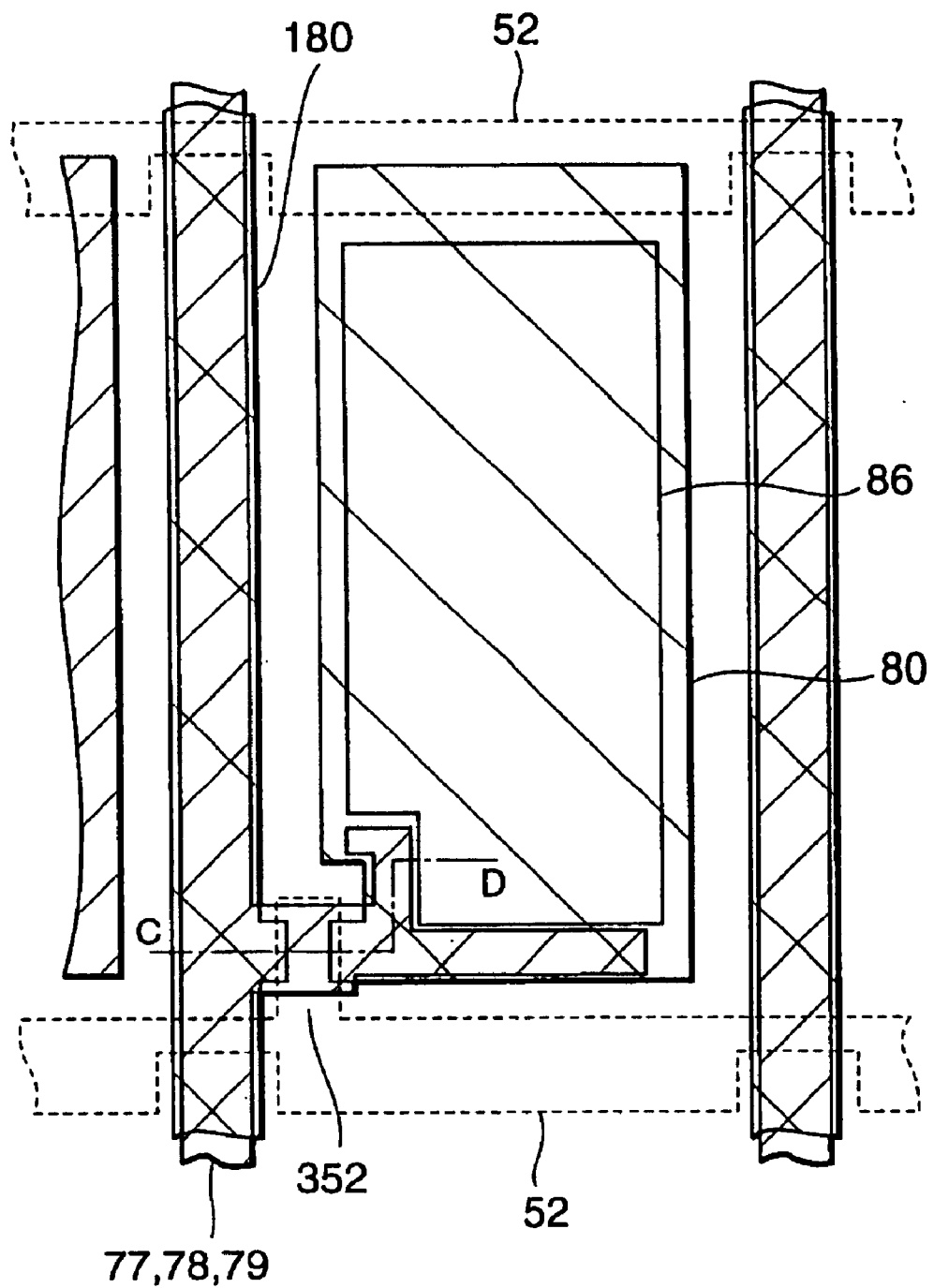
FIG. 10 is a plan view of a pixel for explaining a concrete example of the present invention.

Next, a pixel formed on an active matrix substrate simultaneously with the terminal part, and protection circuit will be described with reference to FIGS. 10 and 11. FIG. 10 is a plan view of one pixel. Slanted lines are also used for parts for easier recognition. In addition, FIGS. 11(a) to 11(d) are cross sectional views of a TFT constituting a pixel according to the manufacturing process steps in the order along line C–D shown in FIG. 10. In addition, the same reference numerals will be assigned to the same parts as those shown in FIGS. 8 and 9.

Figure 11A:
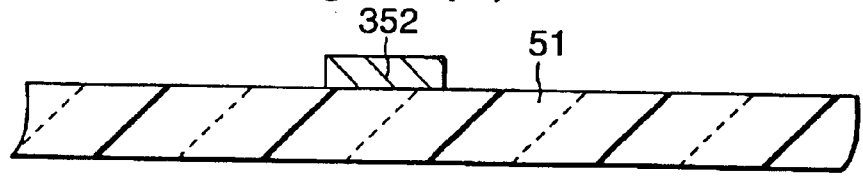
FIGS. 11 (a) to 11(d) are cross sectional views of a manufacturing process in order of a TFT in the pixel.
Figure 11B:
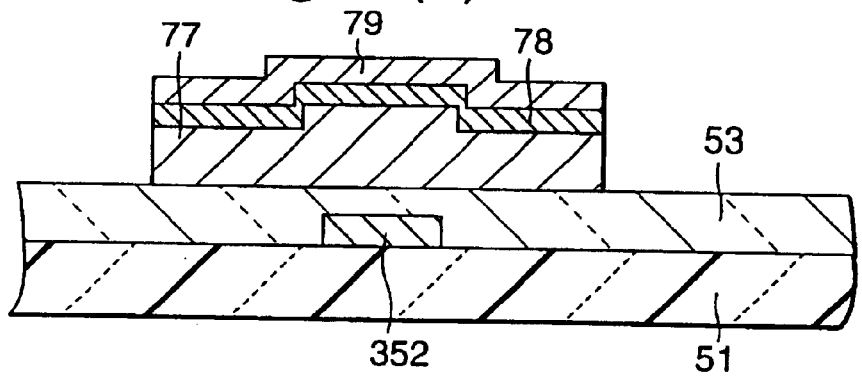

By patterning a Cr film in a first photolithography process, as shown in FIGS. 10 and 11(a), the gate wiring 52 and a gate electrode 352 are formed on the glass substrate 51. The gate wiring 52 including the gate electrode 352 are formed simultaneously with the gate wiring 52 shown in FIG. 8.

After that, a gate insulation layer, an amorphous silicon film, an n+pattern amorphous silicon film, and a second conductive film are deposited in order and patterned through a second photolithography process to form a laminated film pattern of the semiconductor film, the n+type amorphous silicon film and the second conductive film. A semiconductor film pattern 77, an n+type amorphous silicon film pattern 78 and the second conductive film pattern 79 are indicated by the slanted lines from upper right to lower left in FIG. 10.

Figure 11C:
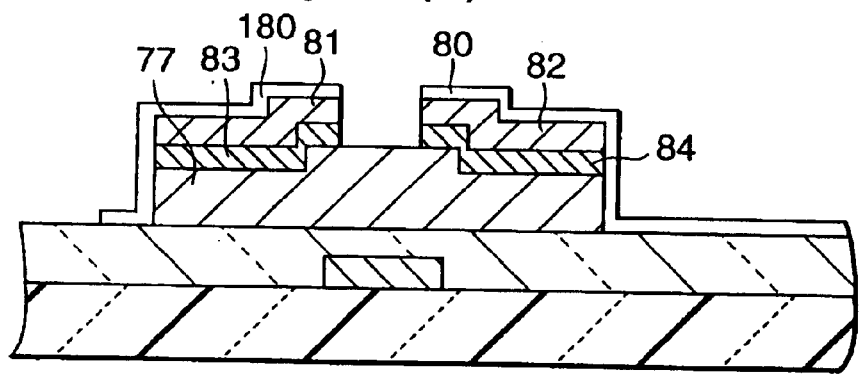

A transparent electrode film is deposited on the entire surface of the glass substrate 51 by a sputtering method and patterned through a third photolithography process to form transparent electrodes 80 and 180 as shown in FIGS. 11(c) and 10. In FIG. 10, the transparent electrodes are indicated by slanted lines from upper left to lower right, and a part of an adjacent pixel is also shown.

The second conductive film pattern 79 and the n+type amorphous silicon film pattern 78 are etched and removed in order by using the transparent electrodes as etching masks. In this manner, as shown in FIG. 11(c), source/drain electrodes 81 and 82 are formed. Simultaneously, ohmic patterns 83 and 84 are formed on end portions of the semiconductor film pattern 77 by removing the n+type amorphous silicon film between source/drain electrodes 81 and 82. The source/drain electrode 81 formed in this manner is included as a part of a drain bus wiring.

Figure 11D:
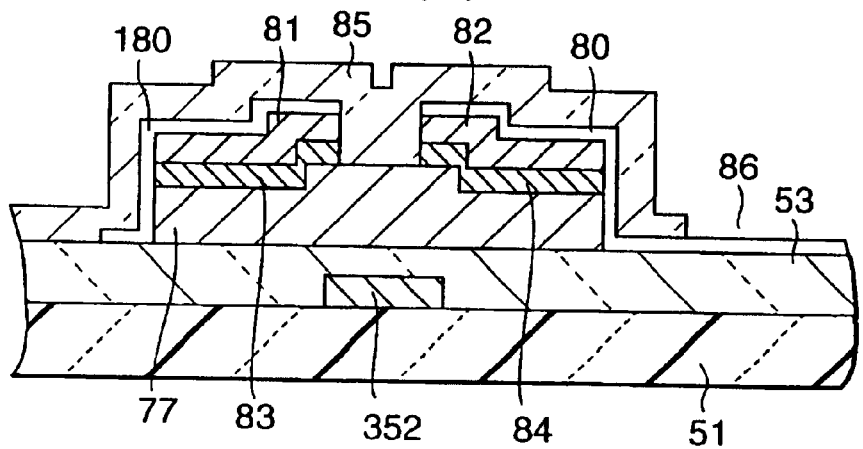

A passivation film 85 is deposited on the whole surface of the glass substrate 51, and through the fourth photolithography process, an opening 86 for a liquid crystal is formed as shown in FIG. 11(d). In this manner, the TFT in the pixel consisting of the gate electrode 352, the gate insulation layer 53, the semiconductor film pattern 77 and the source/drain electrode are formed on the glass substrate 51.

According to the present invention, as described above, it is possible to reduce the number of photolithography process steps for producing an active matrix substrate to four processes. In the manufacturing process of an active matrix substrate, particles are frequently generated in particular in photolithography process. These particles largely influence manufacturing yield of an active matrix substrate since the substrate surface is large. Therefore, the reduction of the number of photolithography process steps according to the present invention greatly contributes to the increase of the manufacturing yield of liquid crystal displays and the enhancement of productivity. In addition, the manufacturing of active matrix substrates becomes more reliable. One of main characteristics of the present invention in the manufacturing method of an active matrix substrate is that first deposit a plurality of films constituting semiconductor devices such as TFT to form laminated films and then form a resist mask having different film thicknesses as an etching mask to pattern the laminated films. Moreover, in the embodiments, although an inverted stagger type TFT is formed on an insulating substrate, instead, a stagger type TFT also can be formed.

Moreover, the present invention can also be applied to an active matrix substrate for a liquid crystal display device utilizing a lateral electric field, called IPS (In Plane Switching).

In the above description, an active matrix substrate for a transmissive liquid crystal display is described in detail. The present invention can be similarly applied also to an active matrix substrate for a reflection type liquid crystal display. In this case, instead of transparent conductive material such as a transparent electrode film and a transparent electrode described in the embodiments is unnecessary, a conductive film with high reflectivity is used.

In addition, the present invention is not limited to the embodiments described above, and it can be changed appropriately in the scope of technology concept of the present invention.

What is claimed is:

1. A manufacturing method of an active matrix substrate comprising the steps of:

a film laminated step for depositing a plurality of films to form laminated films on an insulating substrate;

a resist pattern formation step for forming a resist pattern having a plurality of film thicknesses on said laminated films;

a first etching step for etching said laminated films;
using said resist pattern as a first etching mask;

a resist etching step for etching said resist pattern to remove a thinner portion of said resist pattern; and a second etching step for etching said laminated films using a remaining portion of said resist pattern left after said resist etching process as a second etching mask, and forming a first conductive film pattern on said insulating substrate before said film lamination step in which an insulation layer, a semiconductor film, an ohmic semiconductor film and a second conductive film are deposited in order covering said first conductive film pattern to form said laminated films, wherein said resist pattern is formed so as to have a first portion of said resist pattern thicker than a second portion and said second portion of said resist pattern with an opening therein, at least top two films of said laminated films in said opening are etched and removed in said first etching step, said resist pattern is etched to remove said second portion in said resist etching step, at least an uppermost film of said laminated films is etched and removed in said second etching step, and after said resist etching step, a contact hole formation step for a remaining films of said laminated films in said opening left is etched and removed to form a contact hole in said insulation layer reaching a surface of said first conductive film pattern.

2. The manufacturing method of an active matrix substrate according to claim 1, wherein said first conductive film pattern is a gate wiring including a gate electrode, and after said contact hole formation step, further comprising a lead wiring formation step for removing said resist pattern, depositing a third conductive film on said insulating, forming a wiring formation resist pattern on said third conductive film, etching and removing said third conductive film together with upper films constituting said laminated films and locating higher than said semiconductor film by using said wiring formation resist pattern as a third etching mask to form source/drain electrodes consisting of said third conductive film and said upper films, and to form a lead wiring covering said contact hole.

3. The manufacturing method of an active matrix substrate according to claim 2, wherein any one of said source/drain electrodes is connected with said lead wiring of said third conductive film.

4. The manufacturing method of an active matrix substrate according to claim 2, wherein said lead wiring constitutes a terminal electrode to be connected with an external device in periphery of said insulating substrate.

5. The manufacturing method of an active matrix substrate according to claim 1, wherein said thinner portion of said resist pattern is etched by anisotropic etching using active species that are generated by plasma enhancing a halogen compound gas and an oxygen gas.

6. The manufacturing method of an active matrix substrate according to claim 1, wherein said resist pattern has a plurality of film thicknesses and is formed by exposing a resist film once through a photomask with a mask pattern consisting of light shielding portion, a light half-transmitting portion and a light transmitting portion, and developing said resist film.

7. The manufacturing method of an active matrix substrate according to claim 6, wherein said resist film consists of two resist films laminated having different exposure sensitivity from each other.

8. The manufacturing method of an active matrix substrate according to claim 1, wherein said resist pattern has a plurality of film thicknesses which is formed by exposing sequentially a resist film by using a photomask selected form photomasks with different mask patterns from each other for each exposure, and developing said resist film.

9. The manufacturing method of an active matrix substrate according to claim 8, wherein said each exposure is executed by using different amount of exposure light from each other.

10. The manufacturing method of an active matrix substrate according to claim 8, wherein said resist film consists of two resist films laminated having different exposure sensitivity from each other.

* * * * *